US008269713B2

(12) United States Patent  (10) Patent No.: US 8,269,713 B2
Furuta et al.  (45) Date of Patent: *Sep. 18, 2012

(54) SHIFT REGISTER

(75) Inventors: Shige Furuta, Osaka (JP); Yuhichiroh Murakami, Osaka (JP); Yasushi Sasaki, Osaka (JP); Shinsaku Shimizu, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 230 days.

This patent is subject to a terminal disclaimer.

(21) Appl. No.: 12/733,117

(22) PCT Filed: May 15, 2008

(86) PCT No.: PCT/JP2008/058926
§ 371 (c)(1),
(2), (4) Date: Feb. 12, 2010

(87) PCT Pub. No.: WO2009/034749
PCT Pub. Date: Mar. 19, 2009

(65) Prior Publication Data
US 2010/0141641 A1 Jun. 10, 2010

(30) Foreign Application Priority Data

Sep. 12, 2007 (JP) ................................ 2007-236252

(51) Int. Cl.
*G09G 3/36* (2006.01)
(52) U.S. Cl. ........................................ 345/100; 345/213
(58) Field of Classification Search .......... 345/211–213, 345/98, 100
See application file for complete search history.

(56) References Cited

U.S. PATENT DOCUMENTS

| 4,520,283 | A | 5/1985 | Sasaki et al. |
| 5,222,082 | A | 6/1993 | Plus |
| 5,812,284 | A | 9/1998 | Mizutani et al. |
| 6,339,631 | B1 | 1/2002 | Yeo et al. |
| 2002/0097829 | A1 | 7/2002 | Kawahata |
| 2002/0149318 | A1 | 10/2002 | Jeon et al. |
| 2003/0002615 | A1 | 1/2003 | Morosawa et al. |

(Continued)

FOREIGN PATENT DOCUMENTS

EP  1 231 594  8/2002

(Continued)

OTHER PUBLICATIONS

Supplementary European Search Report dated Aug. 23, 2010.

(Continued)

*Primary Examiner* — Ricardo L Osorio
(74) *Attorney, Agent, or Firm* — Harness, Dickey & Pierce, P.L.C.

(57) ABSTRACT

In one embodiment of the present invention, a unit circuit of a shift register includes a bootstrap circuit configured with a transistor T1, a transistor T2 and a capacitor, a transistor T3, a transistor T4, and a reset signal generation circuit. By use of two-phase clock signals and whose high level periods do not overlap with each other, the reset signal generation circuit generates a reset signal which is at a high level in a normal state and changes to a low level when an input signal turns into the high level. During a period that the reset signal is at the high level, transistors T3 and T4 perform discharge of a node and pull-down of an output signal. Thus, it is possible to obtain a power-saving shift register that fixes an output signal at a low level in a normal state without allowing a through current to flow therein.

12 Claims, 21 Drawing Sheets

U.S. PATENT DOCUMENTS

| | | |
|---|---|---|
| 2003/0227433 A1 | 12/2003 | Moon |
| 2006/0210012 A1 | 9/2006 | Yamaguchi et al. |
| 2006/0291610 A1 | 12/2006 | Lo et al. |
| 2007/0019775 A1 | 1/2007 | Tsai et al. |
| 2007/0153967 A1 | 7/2007 | Yu |

FOREIGN PATENT DOCUMENTS

| | | |
|---|---|---|
| JP | 52-095961 | 8/1977 |
| JP | 55-53925 | 4/1980 |
| JP | 58-029200 | 2/1983 |
| JP | 5-267636 | 10/1993 |
| JP | 2000-114946 | 4/2000 |
| JP | 2001-160299 | 6/2001 |
| JP | 2001-176288 | 6/2001 |
| JP | 2001-273785 | 10/2001 |
| JP | 2006-228312 | 8/2006 |

OTHER PUBLICATIONS

European Office Action dated Apr. 20, 2011.
U.S. Office Action mailed Dec. 16, 2011 for corresponding U.S. Appl. No. 12/733,119.

SHIFT REGISTER

TECHNICAL FIELD

The present invention relates to a shift register, and more particularly relates to a shift register which is suitably used as a drive circuit in a display device and an imaging device, or the like.

BACKGROUND ART

An active matrix type display device selects pixel circuits arranged in a two dimensional manner on a row basis and writes voltages in the selected pixel circuits in accordance with display data to display an image. In order to select pixel circuits on a row basis, a shift register is used as a scanning signal line drive circuit to sequentially shift an output signal based on a clock signal. In a display device performing dot sequential driving, moreover, a data signal line drive circuit includes a shift register which is similar to that described above.

In a liquid crystal display device and the like, occasionally, a drive circuit for pixel circuits is formed monolithically with the pixel circuits by a manufacturing process for forming TFTs (Thin Film Transistors) in the pixel circuits. In this case, preferably, the drive circuit including a shift register is formed by transistors which are equal in conduction type to the TFTs, in order to reduce manufacturing cost. Moreover, increase of clock signals to be supplied to the shift register causes increase of layout area and power consumption of clock interconnection, and the like. In consideration of such a circumstance, it is necessary to configure a shift register that operates based on two-phase clock signals, by use of transistors of an identical conduction type.

In a shift register configured with an N-channel type transistor, a bootstrap circuit shown in FIG. 33 is used for outputting a clock signal without changing a voltage level of the clock signal. In the circuit shown in FIG. 33, when an input signal IN turns into a high level, a node N1 is precharged to a voltage potential (VDD−Vth) (VDD: a power supply voltage, Vth: a threshold voltage of a transistor T1) and a transistor T2 turns into an On state. Thereafter, when the input signal IN turns into a low level, the node N1 turns into a floating state; however, the transistor T2 is maintained at the On state.

In this state, when a clock signal CK changes from the low level to the high level, the voltage potential at the node N1 becomes higher than VDD by function of a capacitor C1 provided between a gate terminal and a source terminal of the transistor T2 (a bootstrap effect). Therefore, the clock signal CK having a maximum voltage of VDD passes through the transistor T2 without voltage drop, and then is output from an output terminal OUT without change of the voltage level thereof.

In order to configure a shift register for use in a display device and the like by use of the circuit shown in FIG. 33, it is necessary to add a function of discharging the node N1 and a function of pulling down the output signal OUT. With regard to this point, conventionally, there have been known the following techniques. As shown in FIG. 34, Patent Document 1 describes a configuration in that a transistor Q11 discharges a node N1, based on an output signal from a subsequent circuit, and a transistor Q12 pulls down an output signal OUT, based on a clock signal CK2. As shown in FIG. 35, Patent Document 2 describes a configuration in that a transistor Q21 discharges a node N1 and transistors Q22 and Q23 pull down an output signal OUT, based on an output signal CT from a subsequent circuit.

[Patent Document 1] Japanese Laid-Open Patent Publication No. 2001-273785
[Patent Document 2] Japanese Laid-Open Patent Publication No. 2002-258819

DISCLOSURE OF THE INVENTION

Problems to be Solved by the Invention

In the circuit shown in FIG. 34, however, an output terminal OUTi turns into a floating state during a period that the clock signal CK2 is at a low level. Consequently, a shift register erroneously operates because of an influence of noise contained in an output signal OUTi in some instances. In the circuit shown in FIG. 35, a transistor Q24 for pull-up is provided for preventing a node N2 from turning into a floating state. In this circuit, however, a through current flows via the transistor Q24 and a transistor Q25 during a period that an input signal IN is at a high level and also flows via the transistor Q24 and a transistor Q26 during a period that the output signal OUT is at the high level, resulting in increase of power consumption.

Hence, it is an object of the present invention to provide a power-saving shift register capable of fixing an output signal at a predetermined level in a normal state without allowing a through current to flow therein.

Solutions to the Problems

A first aspect of the present invention provides a shift register having a configuration in that unit circuits each configured with transistors of an identical conduction type are cascaded, and operating based on two-phase clock signals whose on-level periods do not overlap with each other, wherein the unit circuit includes: an output control transistor having a first conduction terminal supplied with one of the clock signals, and a second conduction terminal connected to an output terminal; a precharge circuit for applying an on-voltage to a control terminal of the output control transistor during a period that an input signal is at an on-level; a reset signal generation circuit for generating a reset signal which turns into the on-level in a normal state, by use of the two-phase clock signals, and changing the reset signal to an off-level when the input signal turns into the on-level; and a discharge circuit for applying an off-voltage to the control terminal of the output control transistor during a period that the reset signal is at the on-level.

A second aspect of the present invention provides the shift register in the first aspect of the present invention, wherein the unit circuit further includes an output reset circuit for applying the off-voltage to the output terminal during the period that the reset signal is at the on-level.

A third aspect of the present invention provides the shift register in the first aspect of the present invention, wherein the reset signal generation circuit includes: a first transistor having a control terminal supplied with one of the clock signals, and a first conduction terminal applied with the on-voltage; a second transistor having a control terminal supplied with the remaining clock signal, and a first conduction terminal connected to a second conduction terminal of the first transistor; and a third transistor having a control terminal supplied with the input signal, a first conduction terminal connected to a second conduction terminal of the second transistor, and a second conduction terminal applied with the off-voltage, and the reset signal is output from a connection point between the second and third transistors.

A fourth aspect of the present invention provides the shift register in the first aspect of the present invention, wherein the unit circuit further includes an initialization circuit for fixing the reset signal at the on-level in accordance with an initialization signal.

A fifth aspect of the present invention provides the shift register in the first aspect of the present invention, wherein the unit circuit further includes an additional output control transistor having a control terminal and a first conduction terminal connected as in those of the output control transistor, and a second conduction terminal connected to an additional output terminal, and an output signal from the output terminal is output externally, and an output signal from the additional output terminal is supplied to the subsequent unit circuit.

A sixth aspect of the present invention provides the shift register in the fifth aspect of the present invention, wherein the unit circuit further includes an additional output reset circuit for applying the off-voltage to the additional output terminal during the period that the reset signal is at the on-level.

A seventh aspect of the present invention provides a display device including: a plurality of pixel circuits arranged in a two dimensional manner; and a drive circuit including the shift register according to any one of the first to sixth aspects of the present invention.

Effects of the Invention

According to the first aspect of the present invention, it is possible to generate the reset signal at the on-level without flow of a through current by use of the two-phase clock signals whose on-level periods do not overlap with each other, and to apply the off-voltage to the control terminal of the output control transistor by use of the reset signal. Accordingly, it is possible to fix an output signal at a predetermined level in a normal state without flow of a through current while achieving low power consumption.

According to the second aspect of the present invention, it is possible to apply the off-voltage to the output terminal by use of the reset signal used upon application of the off-voltage to the control terminal of the output control transistor. Accordingly, it is possible to fix an output signal at an off-level without flow of a through current while achieving low power consumption.

According to the third aspect of the present invention, it is possible to generate the reset signal which is at the on-level in the normal state and changes to the off-level when the input signal turns into the on-level, by use of fewer transistors.

According to the fourth aspect of the present invention, it is possible to turn the reset signal into the on-level and to turn all the output signals into the off-level in such a manner that the initialization signal is supplied externally upon initialization.

According to the fifth aspect of the present invention, it is possible to prevent erroneous operations of the shift register in such a manner that the external output signal and the input signal to the subsequent unit circuit are output from the unit circuit in a separate manner.

According to the sixth aspect of the present invention, it is possible to apply the off-voltage to the additional output terminal by use of the reset signal used upon application of the off-voltage to the control terminal of the output control transistor. Accordingly, it is possible to fix an additional output signal at an off-level without flow of a through current while achieving low power consumption.

According to the seventh aspect of the present invention, it is possible to obtain a power-saving display device by use of a drive circuit including a power-saving shift register.

Figure 1:
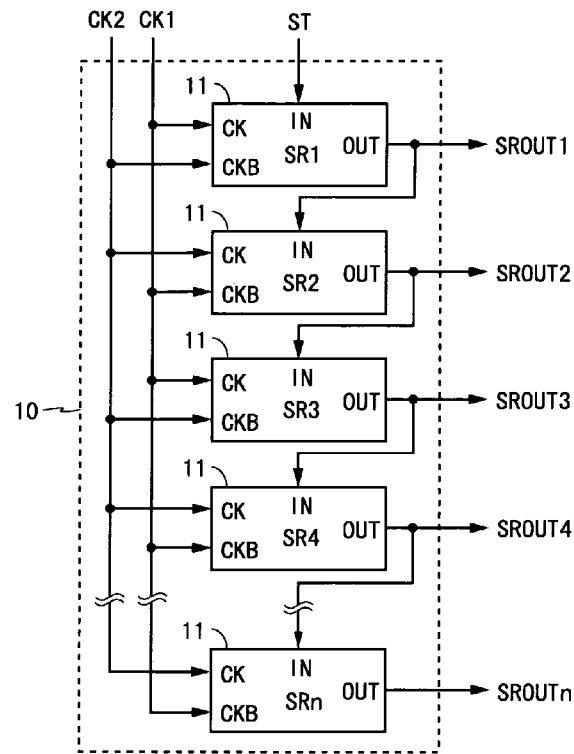
FIG. 1 is a block diagram showing a configuration of a shift register according to a first embodiment of the present invention.

DESCRIPTION OF REFERENCE SYMBOLS 10, 20, 30, 50, 60, 70, 80, 90 Shift register
11, 17, 18, 19, 21, 31, 41, 51, 61, 71, 81 Unit circuit
12 Reset signal generation circuit
13, 15, 16 Precharge circuit
22 Scanning direction switch circuit
32, 33 Initialization circuit
82 Buffer
110, 120 Liquid crystal display device
111, 121 Pixel array
112, 122 Display control circuit
113, 123 Scanning signal line drive circuit
114, 124 Data signal line drive circuit
125 Sampling switch

BEST MODE FOR CARRYING OUT THE INVENTION

First Embodiment

FIG. 1 is a block diagram showing a configuration of a shift register according to a first embodiment of the present invention. The shift register 10 shown in FIG. 1 has a configuration in that n (n: an integer of two or more) unit circuits 11 are cascaded. The unit circuit 11 has a clock terminal CK, a clock terminal CKB, an input terminal IN and an output terminal OUT. In the following, signals to be input/output via the respective terminals are described using designations equal to the relevant terminals. (For example, a signal to be input via the clock terminal CK is referred to as a clock signal CK.)

A start pulse ST and two-phase clock signals CK1 and CK2 are supplied externally to the shift register 10. The start pulse ST is supplied to the input terminal IN of the first unit circuit 11. The clock signal CK1 is supplied to the clock terminal CK of the odd-numbered unit circuit 11 and the clock terminal CKB of the even-numbered unit circuit 11. The clock signal CK2 is supplied to the clock terminal CKB of the odd-numbered unit circuit 11 and the clock terminal CK of the even-numbered unit circuit 11. Output signals OUT from the unit circuits 11 are output externally as output signals SROUT1 to SROUTn. Moreover, the output signal OUT from the unit circuit 11 is supplied to the input terminal IN of the subsequent unit circuit 11.

Figure 2:
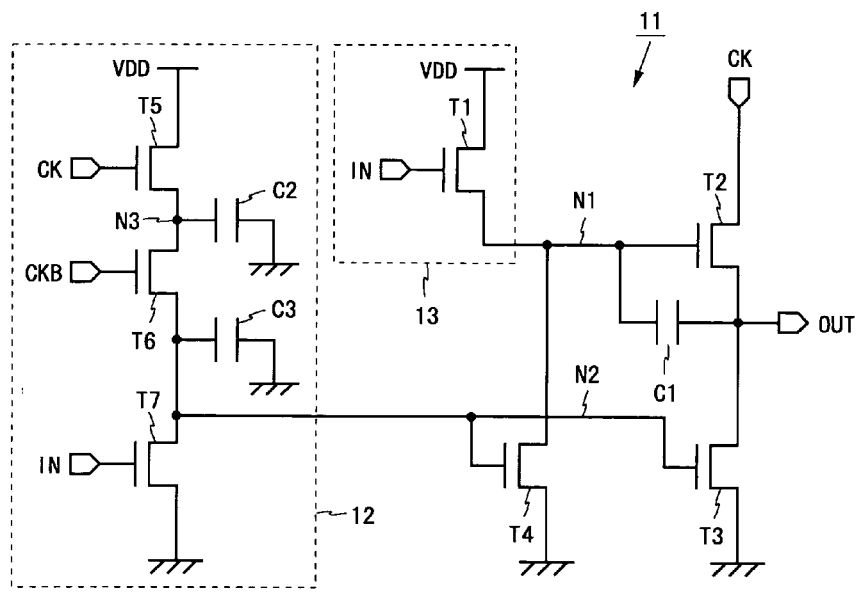
FIG. 2 is a circuit diagram of a unit circuit included in the shift register shown in FIG. 1.

FIG. 2 is a circuit diagram of the unit circuit 11 included in the shift register 10. As shown in FIG. 2, the unit circuit 11 is configured with transistors of an identical conduction type, and includes seven N-channel type transistors T1 to T7 and three capacitors C1 to C3. In the following, a voltage (a level of a signal) which is applied to a gate terminal to turn a transistor into an On state is referred to as an on-voltage (an on-level), and a voltage (a level of a signal) which is applied to the gate terminal to turn the transistor into an Off state is referred to as an off-voltage (an off-level). In an N-channel type transistor, a High voltage corresponds to the on-voltage (a high level corresponds to the on-level), and a Low voltage corresponds to the off-voltage (a low level corresponds to the off-level). In a P-channel type transistor, these relations are reversed.

The transistor T1 has a drain terminal applied with a power supply voltage VDD, and a gate terminal connected to the input terminal IN. A source terminal of the transistor T1 is connected to a gate terminal of the transistor T2 and a drain terminal of the transistor T4. In the following, this connection point is referred to as a node N1. The transistor T2 has a drain terminal connected to the clock terminal CK, and a source terminal connected to the output terminal OUT and a drain terminal of the transistor T3. Source terminals of the transistors T3 and T4 are connected to a ground.

The transistor T5 has a drain terminal applied with the power supply voltage VDD, and a source terminal connected to a drain terminal of the transistor T6. A source terminal of the transistor T6 is connected to a drain terminal of the transistor T7. A source terminal of the transistor T7 is connected to the ground. Gate terminals of the transistors T5 to T7 are connected to the clock terminal CK, the clock terminal CKB and the input terminal IN, respectively. A connection point between the transistors T6 and T7 is connected to the gate terminals of the transistors T3 and T4. In the following, this connection point is referred to as a node N2 and a connection point between the transistors T5 and T6 is referred to as a node N3.

Each of the capacitors C1 to C3 is a capacitive element. The capacitor C1 is provided between the gate terminal and the source terminal of the transistor T2, the capacitor C2 is provided between the node N3 and the ground, and the capacitor C3 is provided between the node N2 and the ground. The capacitor C1 functions as a bootstrap capacitor, and each of the capacitors C2 and C3 functions as a charge pump capacitor. In the following, it is assumed that the capacitor C2 is equal in capacitance value to the capacitor C3.

In the unit circuit 11, the transistors T5 to T7 and the capacitors C2 and C3 form a reset signal generation circuit 12. Moreover, the transistors T1 to T4 function as a precharge circuit 13, an output control transistor, an output reset circuit and a discharge circuit, respectively. The transistor T2 switches whether to output the clock signal CK from the output terminal OUT, in accordance with a voltage potential at the gate terminal. During a period that the input signal IN is at the high level, the transistor T1 applies the High voltage to the node N1 (the gate terminal of the transistor T2). The reset signal generation circuit 12 generates a reset signal which is at the high level in a normal state and changes to the low level when the input signal IN turns into the high level. During a period that the reset signal is at the high level, the transistor T4 applies the Low voltage to the node N1. During the period that the reset signal is at the high level, the transistor T3 applies the Low voltage to the output terminal OUT.

Figure 3:
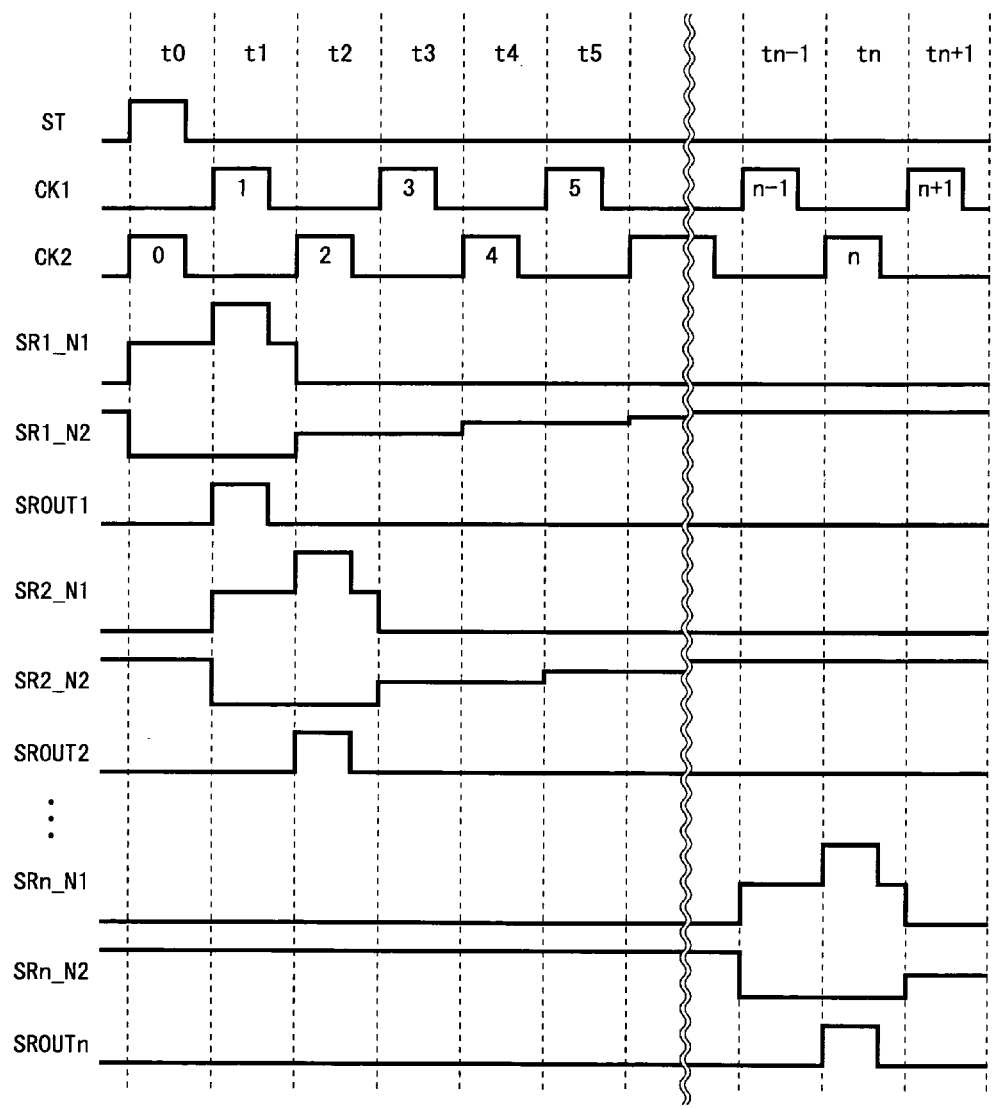
FIG. 3 is a timing chart of the shift register shown in FIG. 1.

FIG. 3 is a timing chart of the shift register 10. In FIG. 3, periods t0 to tn+1 correspond to one line period (one horizontal period), and each period is divided into a first half and a second half. The start pulse ST turns into the high level in the first half of the period t0, the clock signal CK1 turns into the high level in the first half of the period to (o is an odd number; hereinafter, referred to as an odd period), and the clock signal CK2 turns into the high level in the first half of the period to (e is an even number; hereinafter, referred to as an even period). These three signals turn into the low level during the remaining periods. As described above, the clock signals CK1 and CK2 have a characteristic in that the respective high level periods do not overlap with each other. In the following, it is assumed that all the input/output signals and signals in the shift register 10, including the clock signals CK1 and CK2, have a voltage potential which is VDD at the high level and VSS (zero) at the low level unless otherwise specified.

Upon reception of the input signal shown in FIG. 3, the first unit circuit 11 (hereinafter, referred to as the unit circuit SR1) operates as follows. In the unit circuit SR1, the input signal IN turns into the high level in the first half of the period t0, the clock signal CK turns into the high level in the first half of the odd period, and the clock signal CKB turns into the high level in the first half of the even period.

Prior to the period t0, the input signal IN is at the low level; therefore, the transistors T1 and T7 are in the Off state. Herein, a voltage potential at the node N2 and a voltage potential at the node N3 are VDD (the reason therefor will be described later); therefore, the transistors T3 and T4 are in the On state. Accordingly, a voltage potential at the node N1 and a voltage potential at the output terminal OUT are VSS, and the transistor T2 is in the Off state. At this point in time, no electrical charge is stored in the capacitor C1, and electrical charge is stored in each of the capacitors C2 and C3 in accordance with the power supply voltage VDD.

In the first half of the period t0, the input signal IN and the clock signal CKB turn into the high level; therefore, the transistors T1, T6 and T7 turn into the On state. Thus, the electrical charge stored in each of the capacitors C2 and C3 is discharged, the voltage potentials at the nodes N2 and N3 turn into VSS, and transistors T3 and T4 turn into the Off state. When the transistor T1 turns into the On state, the voltage potential at the node N1 turns into (VDD−Vth) (Vth: a threshold voltage of the transistor T1), so that the transistor T2 turns into the On state. Herein, the clock signal CK is at the low level; therefore, the output signal OUT is maintained at the low level. Thus, electrical charge is stored in the capacitor C1 in accordance with a gate-source potential difference (VDD−Vth) of the transistor T2.

In the second half of the period t0, the input signal IN and the clock signal CKB turn into the low level; therefore, the transistors T1, T6 and T7 turn into the Off state. When the transistor T1 turns into the Off state, the node N1 turns into a floating state; however, the voltage potential at the node N1 is held at (VDD−Vth) by the capacitor C1.

In the first half of the period t1, the clock signal CK turns into the high level. Herein, the transistor T2 is in the On state; therefore, the output signal OUT also turns into the high level. The node N1 is in the floating state, and the node N1 and the source terminal of the transistor T2 are connected via the capacitor C1 that holds the potential difference (VDD−Vth); therefore, the voltage potential at the source terminal of the transistor T2 changes from VSS to VDD, so that the voltage potential at the node N1 changes by the same amount and becomes higher than the power supply voltage VDD (a bootstrap effect). Thus, the clock signal CK having a maximum voltage of VDD passes through the transistor T2 without voltage drop, and is output from the output terminal OUT without change of a voltage level thereof. Moreover, when the clock signal CK turns into the high level, the transistor T5 turns into the On state. Herein, the transistor T6 is in the Off state; therefore, the voltage potential at the node N3 turns into VDD, so that electrical charge is stored in the capacitor C2 in accordance with the power supply voltage VDD.

In the second half of the period t1, the clock signal CK turns into the low level. Herein, the transistor T2 is in the On state; therefore, the output signal OUT also turns into the low level, and the voltage potential at the node N1 returns to (VDD−Vth). Moreover, the transistor T5 turns into the Off state. At the end of the period t1, the voltage potential at the node N2 is VSS and the voltage potential at the node N3 is VDD.

In the first half of the period t2, the clock signal CKB turns into the high level; therefore, the transistor T6 turns into the On state. Herein, the electrical charge stored in the capacitor C2 partly moves to the capacitor C3, so that the voltage potential at the node N2 rises. In the case where the capacitor C2 is equal in capacitance value to the capacitor C3, the node N2 becomes equal in voltage potential to the node N3, and the voltage potential at the node N2 rises to VDD/2. The capacitance value of the capacitors C2 and C3 is determined such that the voltage potential at the node N2 at this point in time becomes higher than threshold voltages at the transistors T3 and T4. In the first half of the period t2, thus, the transistors T3 and T4 turn into the On state, and the voltage potential at the node N1 and the voltage potential at the output terminal OUT turn into VSS.

Thereafter, the reset signal generation circuit 12 in the unit circuit SR1 operates as follows. In the first half of the odd period, the clock signal CK turns into the high level and the clock signal CKB turns into the low level; therefore, the transistor T5 turns into the On state and the transistor T6 turns into the Off state. Herein, the voltage potential at the node N3 turns into VDD and electrical charge is stored in the capacitor C2 in accordance with the power supply voltage VDD. In the first half of the even period, on the other hand, the clock signal CK turns into the low level and the clock signal CKB turns into the high level; therefore, the transistor T5 turns into the Off state and the transistor T6 turns into the On state. Herein, the electrical charge stored in the capacitor C2 partly moves to the capacitor C3, so that the voltage potential at the node N2 rises. In the case where the capacitor C2 is equal in capacitance value to the capacitor C3, the voltage potential at the node N2 gradually rises to eventually reach VDD.

As shown in FIG. 3, thus, the voltage potential (designated by SR1_N1; hereinafter, this symbol designates the same meaning) at the node. N1 in the unit circuit SR1 turns into (VDD−Vth) in the period t0 and the second half of the period t1, becomes higher than VDD in the first half of the period t1, and turns into VSS in the remaining periods. The voltage potential at the node N2 in the unit circuit SR1 turns into VSS in the periods t0 and t1, and gradually rises in the period t2 and the periods subsequent to the period t2 to eventually turn into VDD. The output signal OUT from the unit circuit SR1 (the output signal SROUT1 from the shift register 10) turns into the high level in the first half of the period t1 and turns into the low level in the remaining periods.

Likewise, the output signal OUT from the i-th (i: an integer in a range of one or more to n or less) unit circuit 11 (the output signal SROUTi from the shift register 10) turns into the high level in the first half of the period ti and turns into the low level in the remaining periods. As described above, the shift register 10 sequentially turns the output signals SROUT1 to SROUTn into the high level one by one, based on the two-phase clock signals CK1 and CK2.

Figure 4:
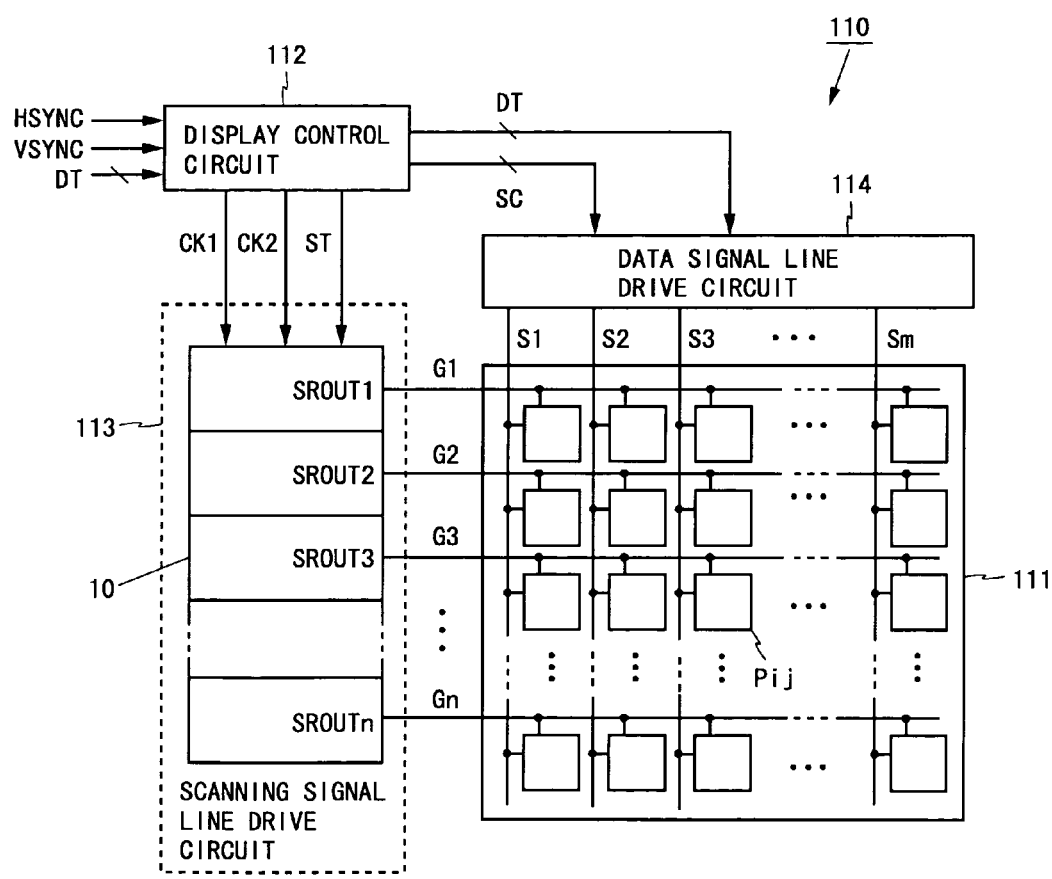
FIG. 4 is a block diagram showing a configuration of a liquid crystal display device including the shift register shown in FIG. 1.

The shift register 10 is used as a drive circuit in a display device and an imaging device, or the like, for example. FIG. 4 is a block diagram showing a configuration of a liquid crystal display device including the shift register 10. The liquid crystal display device 110 shown in FIG. 4 is an active matrix type display device including a pixel array 111, a display control circuit 112, a scanning signal line drive circuit 113 and a data signal line drive circuit 114. In the liquid crystal display device 110, the shift register 10 is used as the scanning signal line drive circuit 113.

The pixel array 111 shown in FIG. 4 includes n scanning signal lines G1 to Gn, m data signal lines S1 to Sm, and (m×n) pixel circuits Pij (m: an integer of two or more, j: an integer in a range of one or more to m or less). The scanning signal lines G1 to Gn are arranged in parallel with one another, and the data signal lines S1 to Sm are arranged in parallel with one another so as to be orthogonal to the scanning signal lines G1 to Gn. The pixel circuit Pij is arranged near an intersection of the scanning signal line Gi and the data signal line Sj. As described above, the (m×n) pixel circuits Pij are arranged in a two dimensional manner in which m pixel circuits are arranged in a row direction while n pixel circuits are arranged in a column direction. The scanning signal line Gi is connected to all the pixel circuits Pij on the i-th row, and the data signal line Sj is connected to all the pixel circuits Pij on the j-th column.

The liquid crystal display device 110 is externally supplied with control signals such as a horizontal synchronous signal HSYNC and a vertical synchronous signal VSYNC, and display data DT. Based on these signals, the display control circuit 112 outputs a clock signal CK1, a clock signal CK2 and a start pulse ST to the scanning signal line drive circuit 113, and outputs a control signal SC and the display data DT to the data signal line drive circuit 114.

The scanning signal line drive circuit 113 is configured with the shift register 10 having n stages. Based on the clock signals CK1 and CK2, the shift register 10 sequentially turns the output signals SROUT1 to SROUTn into the high level (indicating a selection state) one by one. The output signals SROUT1 to SROUTn are supplied to the scanning signal lines G1 to Gn, respectively. Thus, the scanning signal lines G1 to Gn are sequentially selected one by one, so that the pixel circuits Pij on one row are collectively selected.

Based on the control signal SC and the display data DT, the data signal line drive circuit 114 applies voltages according to the display data DT to the data signal lines S1 to Sm. Thus, the voltages according to the display data DT are written in the selected pixel circuits Pij on one row. By the operations described above, the liquid crystal display device 110 displays an image.

Figure 5:
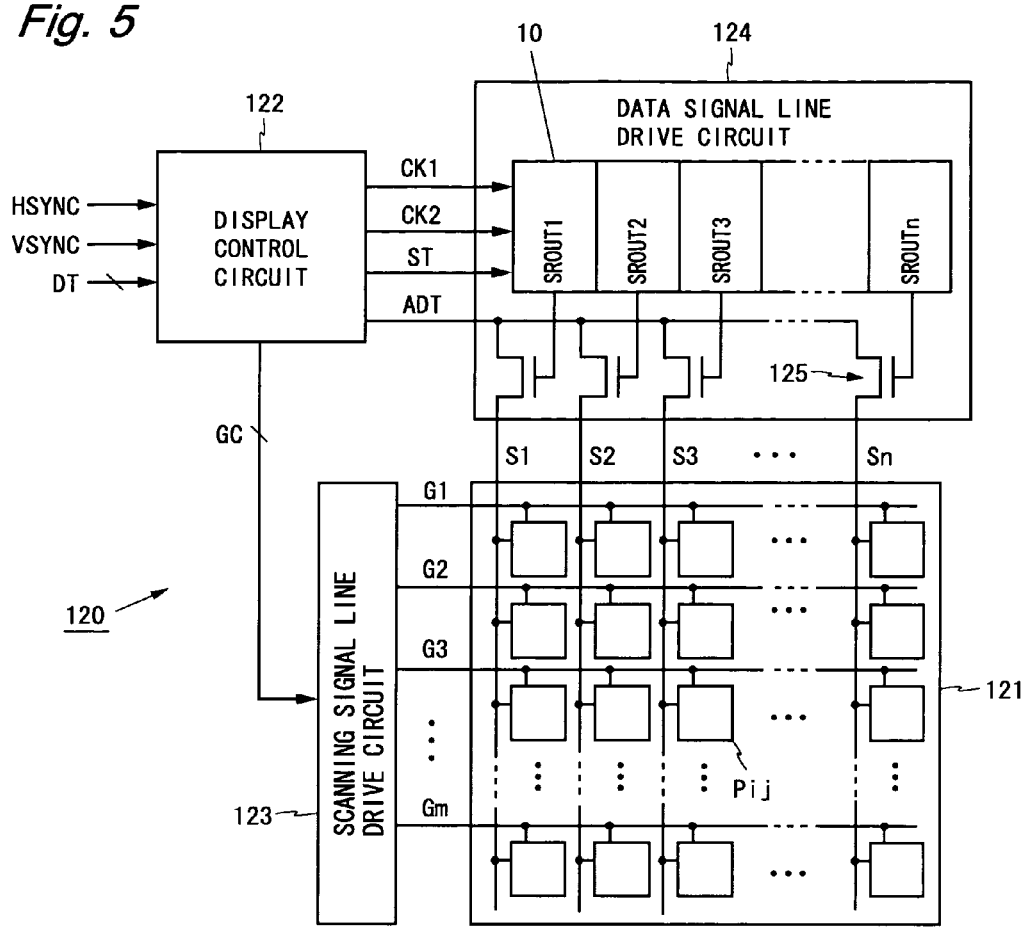
FIG. 5 is a block diagram showing a configuration of a different liquid crystal display device including the shift register shown in FIG. 1.

FIG. 5 is a block diagram showing a configuration of a different liquid crystal display device including the shift register 10. The liquid crystal display device 120 shown in FIG. 5 is an active matrix type display device including a pixel array 121, a display control circuit 122, a scanning signal line drive circuit 123 and a data signal line drive circuit 124. In the liquid crystal display device 120, the shift register 10 is used while being incorporated in the data signal line drive circuit 124 that performs dot sequential driving.

The pixel array 121 shown in FIG. 5 is similar in configuration to the pixel array 111 shown in FIG. 4. However, the pixel array 121 includes m scanning signal lines and n data signal lines, and (m×n) pixel circuits Pij are arranged in a two-dimensional manner in which n pixel circuits are arranged in a row direction while m pixel circuits are arranged in a column direction.

Based on the control signals and the display data DT each given externally, the display control circuit 122 outputs a control signal GC to the scanning signal line drive circuit 123, and outputs a clock signal CK1, a clock signal CK2, a start pulse ST and analog display data ADT to the data signal line drive circuit 124. Based on the control signal GC, the scanning signal line drive circuit 123 sequentially selects the scanning signal lines G1 to Gm one by one.

The data signal line drive circuit 124 includes the shift register 10 having the n stages, and n sampling switches 125. The n sampling switches 125 have first ends connected to the data signal lines S1 to Sn, respectively, and second ends supplied with the analog display data ADT. The n sampling switches 125 have gate terminals supplied with the output signals SROUT1 to SROUTn from the shift register 10, respectively.

The output signals SROUT1 to SROUTn sequentially turn into the high level one by one; therefore, the n sampling switches 125 sequentially turn into the On state one by one, and the analog display data ADT is supplied to the data signal line connected to the sampling switch 125 in the On state. Thus, voltages according to the display data DT are sequentially written in the pixel circuits Pij on one row selected by the scanning signal line drive circuit 123 one by one. By the operations described above, the liquid crystal display device 120 displays an image. Herein, one output signal SROUTi may be supplied to the gate terminals of the plurality of sampling switches.

As described above, the shift register 10 is used as the scanning signal line drive circuit of the display device or is used while being incorporated in the data signal line drive circuit of the display device. In addition to this, the shift register 10 is used as a drive circuit in an imaging device, or the like. By use of the shift register 10 in the display device, the imaging device and the like, it is possible to correctly drive scanning signal lines or data signal lines.

Hereinafter, description will be given of effects of the shift register 10 according to this embodiment. As described above, the reset signal generation circuit 12 in the unit circuit 11 generates the reset signal at the high level, based on the two-phase clock signals CK1 and CK2 whose high level periods do not overlap with each other, and changes the reset signal to the low level when the input signal IN turns into the high level. By use of the reset signal, the unit circuit 11 applies the Low voltage to the gate terminal of the transistor T2 and the output terminal OUT. (That is, the unit circuit 11 performs the discharge of the node N1 and the pull-down of the output signal OUT.)

In the shift register 10, as described above, the high level periods of the clock signals CK1 and CK2 do not overlap with each other; therefore, there are no possibilities that the transistors T5 and T6 simultaneously turn into the On state and the through current flows in the transistors T5 and T6. For this reason, it is possible to generate the reset signal at the high level without flow of the through current and to perform the discharge of the node N1 and the pull-down of the output signal OUT by use of this reset signal. Accordingly, the shift register 10 can fix the output signal OUT at the low level in the normal state without allowing the through current to flow therein while achieving low power consumption.

In the shift register 10, further, it is possible to generate the reset signal in the unit circuit 11 without use of the output signal from the subsequent unit circuit and to apply the Low voltage to the gate terminal of the transistor T2 and the output terminal OUT by use of this reset signal. Therefore, it is unnecessary to use the output signal from the subsequent circuit in order to perform the discharge of the node N1 and the pull-down of the output signal OUT. Accordingly, the shift register 10 allows reduction of interconnections between circuits, and also allows reduction of layout area and power consumption thereof. Moreover, the shift register 10 uses no output signal from the subsequent circuit, and therefore operates in a stable manner.

The reset signal generation circuit 12 is configured with the transistors T5 to T7 and the capacitors C2 and C3, so that the reset signal, which is at the high level in the normal state and changes to the low level when the input signal IN turns into the high level, can be generated using fewer transistors.

Figure 6:
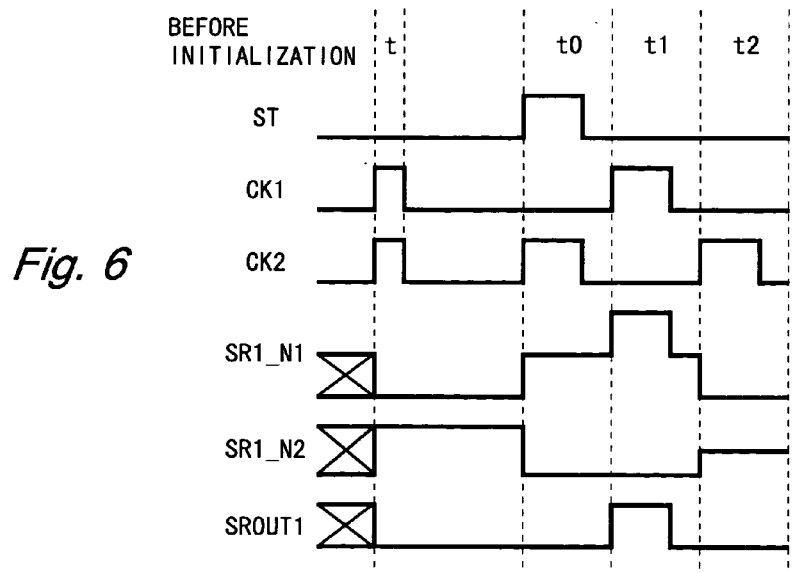
FIG. 6 is a timing chart upon initialization of the shift register shown in FIG. 1.

In the period t shown in FIG. 6, when the start pulse ST at the low level and the clock signals CK1 and CK2 at the high level are supplied to the shift register 10, the voltage potential at the node N2 turns into VDD whereas the voltage potential at the node N1 and the voltage potential at the output terminal OUT turn into VSS in the unit circuit 11. Thus, the shift register 10 can perform the discharge of the node N1 and the pull-down of the output signal OUT, when both the clock signals CK1 and CK2 turn into the high level.

Shift registers according to second to eighth embodiments are similar in configuration to the shift register 10, and are used as in the shift register 10. Hereinafter, description will be given of points of difference between the following embodiments and the first embodiment, and description of commonalities between the following embodiments and the first embodiment will not be given.

Second Embodiment

Figure 7:
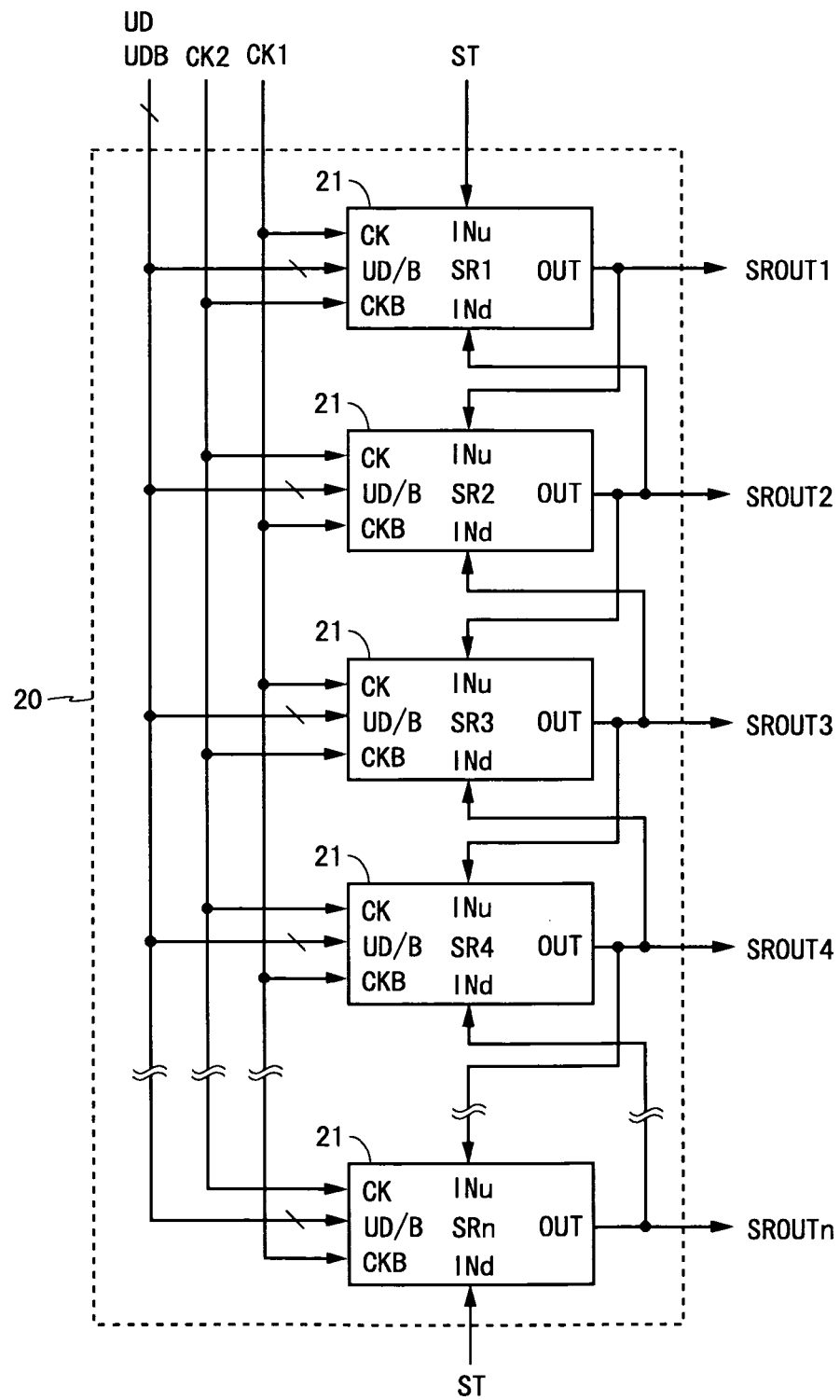
FIG. 7 is a block diagram showing a configuration of a shift register according to a second embodiment of the present invention.

FIG. 7 is a block diagram showing a configuration of a shift register according to a second embodiment of the present invention. The shift register 20 shown in FIG. 7 includes n unit circuits 21 each having a scanning direction switch terminal UD, a scanning direction switch terminal UDB, an input terminal INu and an input terminal INd. The shift register 20 corresponds to the shift register 10 according to the first embodiment to which a function of switching a scanning direction (a direction of shift of an output signal) is added.

In the shift register 20, a direction along which a number of the unit circuit 21 becomes large (a downward direction in FIG. 7) is referred to as a forward direction, and a reverse direction thereof (an upward direction in FIG. 7) is referred to as a backward direction. The unit circuit 21 having the number which is smaller by one is referred to as a forward unit circuit, and the unit circuit 21 having the number which is larger by one is referred to as a rearward unit circuit. When the scanning direction is the forward direction, the forward unit circuit corresponds to a preceding unit circuit whereas the rearward unit circuit corresponds to a subsequent unit circuit. On the other hand, when the scanning direction is the backward direction, the forward unit circuit corresponds to a subsequent unit circuit whereas the rearward unit circuit corresponds to a preceding unit circuit.

A start pulse ST is supplied to the input terminal INu of the first unit circuit 21 and the input terminal INd of the n-th unit circuit 21. An output signal OUT from the unit circuit 21 is supplied to the input terminal INu of the rearward unit circuit 21 and the input terminal INd of the forward unit circuit 21. Scanning direction switch signals UD and UDB (negation of UD) each given externally are supplied to the scanning direction switch terminals UD and UDB of the unit circuit 21, respectively.

Figure 8:
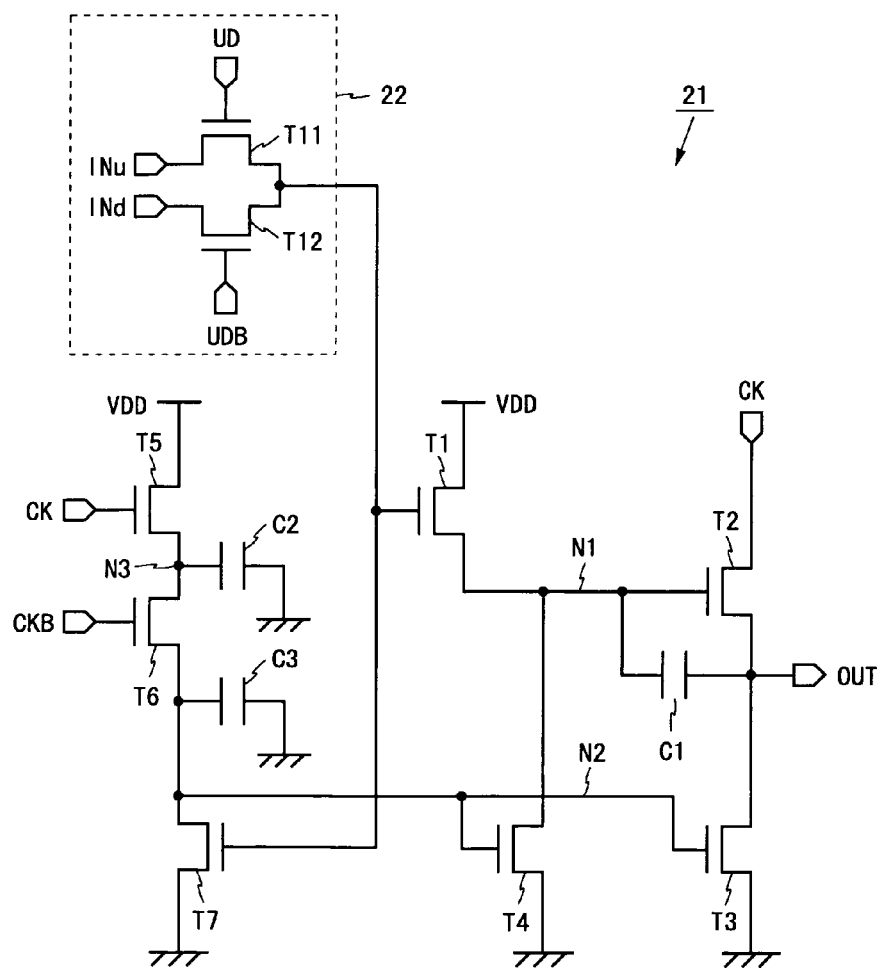
FIG. 8 is a circuit diagram of a unit circuit included in the shift register shown in FIG. 7.

FIG. 8 is a circuit diagram of the unit circuit 21 included in the shift register 20. The unit circuit 21 shown in FIG. 8 corresponds to the unit circuit 11 according to the first embodiment to which a scanning direction switch circuit 22 including two N-channel type transistors T11 and T12 is added. The transistors T11 and T12 have drain terminals connected to the input terminals INu and INd, respectively, and gate terminals connected to the scanning direction switch terminals UD and UDB, respectively. The transistors T11 and T12 have source terminals each connected to an output terminal of the scanning direction switch circuit 22, and this output terminal is connected to a gate terminal of a transistor T1 and a gate terminal of a transistor T7.

When the scanning direction switch signal UD is at a high level and the scanning direction switch signal UDB is at a low level, the transistor T11 turns into an On state, the transistor T12 turns into an Off state, and the gate terminals of the transistors T1 and T7 are connected to the input terminal INu. Herein, the unit circuit 21 receives an output signal from the forward unit circuit 21, and the shift register 20 sequentially shifts the output signal in the forward direction.

When the scanning direction switch signal UD is at the low level and the scanning direction switch signal UDB is at the high level, the transistor T11 turns into the Off state, the transistor T12 turns into the On state, and the gate terminals of the transistors T1 and T7 are connected to the input terminal INd. Herein, the unit circuit 21 receives an output signal from the rearward unit circuit 21, and the shift register sequentially shifts the output signal in the backward direction. In a case where n is an even number, there arises a necessity that high level periods of clock signals CK1 and CK2 are reversed in order to shift the output signal in the backward direction.

The shift register 20 according to this embodiment selects, as an input signal, either the output signal from the forward unit circuit (the input signal INu) or the output signal from the rearward unit circuit (the input signal INd), by use of the scanning direction switch circuit 22, to switch the scanning direction without provision of a dummy stage.

In a conventional shift register that uses an output signal from a subsequent circuit in order to perform discharge of a node N1 and pull-down of an output signal OUT, there is a necessity that one unit circuit includes two circuits similar to the scanning direction switch circuit 22. In the shift register 20, on the other hand, the unit circuit 21 requires only one scanning direction switch circuit 22. Thus, the shift register 20 allows reduction of an amount of circuits in a shift register having a scanning direction switching function.

Third Embodiment

Figure 9:
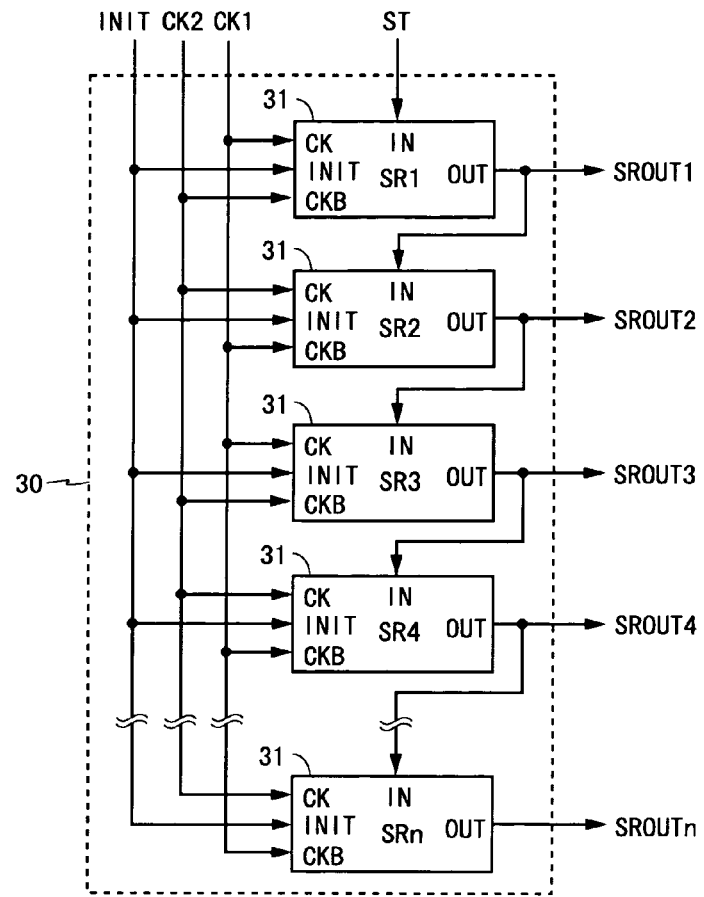
FIG. 9 is a block diagram showing a configuration of a shift register according to a third embodiment of the present invention.

FIG. 9 is a block diagram showing a configuration of a shift register according to a third embodiment of the present invention. The shift register 30 shown in FIG. 9 includes n unit circuits 31 each having an initialization terminal INIT. The shift register 30 corresponds to the shift register 10 according to the first embodiment to which an initializing function is added. In the unit circuit 31, the initialization terminal INIT is supplied with an initialization signal INIT given externally.

Figure 10:
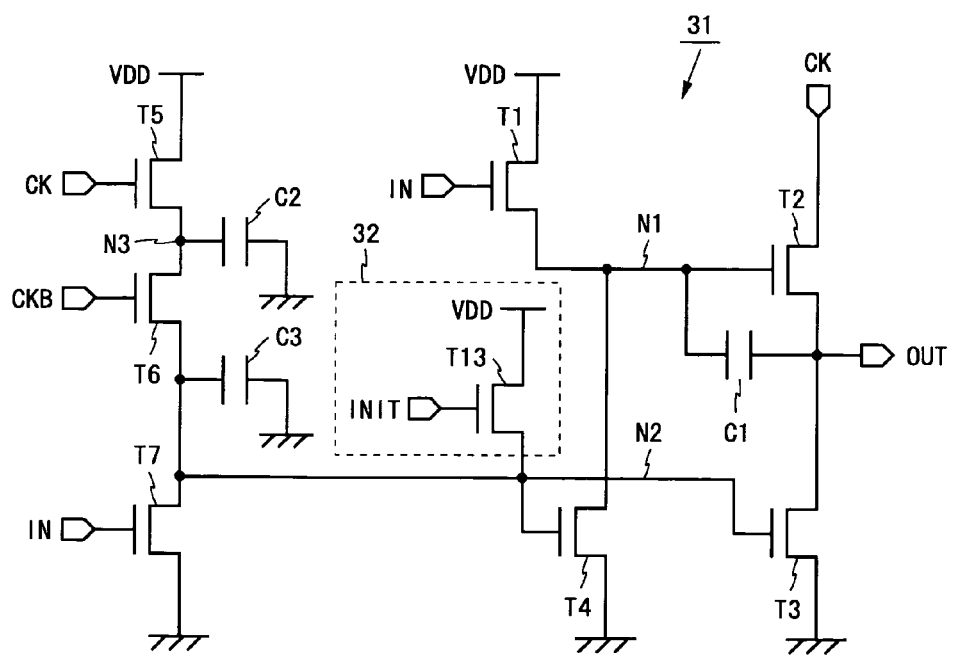
FIG. 10 is a circuit diagram of a unit circuit included in the shift register shown in FIG. 9.

FIG. 10 is a circuit diagram of the unit circuit 31 included in the shift register 30. The unit circuit 31 shown in FIG. 10 corresponds to the unit circuit 11 according to the first embodiment to which an initialization circuit 32 including an N-channel type transistor T13 is added. The transistor T13 has a drain terminal applied with a power supply voltage VDD, a source terminal connected to a node N2, and a gate terminal connected to the initialization terminal INIT.

When the initialization signal INIT is at a low level, the transistor T13 turns into an Off state, and the unit circuit 31 operates as in the unit circuit 11 according to the first embodiment. When the initialization signal INIT is at a high level, the transistor T13 turns into an On state, so that a voltage potential at the node N2 turns into VDD. Therefore, transistors T3 and T4 turn into the On state, and a voltage potential at a node N1 and a voltage potential at an output terminal OUT turn into VSS.

Figure 11:
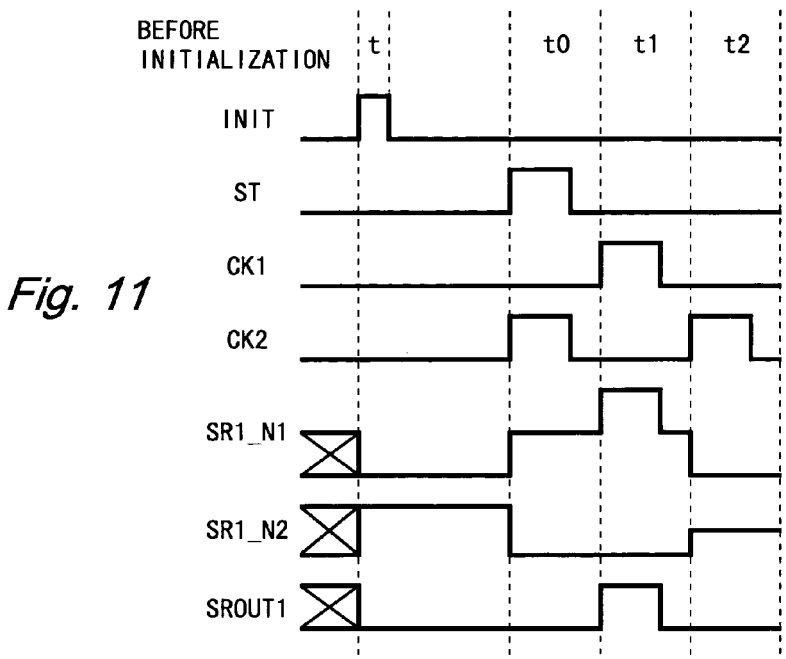
FIG. 11 is a timing chart of the shift register shown in FIG. 9.

FIG. 11 is a timing chart of the shift register 30. As shown in FIG. 11, before initialization, the voltage potential at each of the node N1, the node N2 and the output terminal OUT is not fixed in the unit circuit 31 (shown with a cross mark). During a period t that the initialization signal INIT turns into the high level, the voltage potential at the node N2 turns into VDD, and the voltage potential at the node N1 and the voltage potential at the output terminal OUT turn into VSS.

The shift register 30 according to this embodiment can turn a reset signal into the high level and turn all output signals SROUT1 to SROUTn into the low level when the initialization signal INIT is supplied externally upon initialization.

Figure 12:
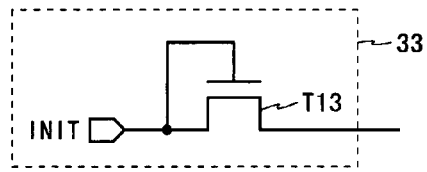
FIG. 12 is a circuit diagram of a different initialization circuit included in the shift register shown in FIG. 9.

The unit circuit 31 may include an initialization circuit 33 shown in FIG. 12 in place of the initialization circuit 32. In the initialization circuit 33, a transistor T13 has a drain terminal and a gate terminal each connected to an initialization terminal INIT. Also in the case of using the initialization circuit 33, during the period that the initialization signal INIT is at the high level, the transistor T13 turns into the On state, the voltage potential at the node N2 turns into VDD, and the voltage potential at the node N1 and the voltage potential at the output terminal OUT turn into VSS. By use of the initialization circuit 33, moreover, it is possible to reduce a stress due to a gate-drain voltage.

Fourth Embodiment

A shift register according to a fourth embodiment of the present invention is identical in configuration to that according to the first embodiment (FIG. 1). The shift register according to this embodiment corresponds to the shift register 10 according to the first embodiment to which a function of fixing a reset signal at a low level during a period that an output signal is at a high level is added.

Figure 13:
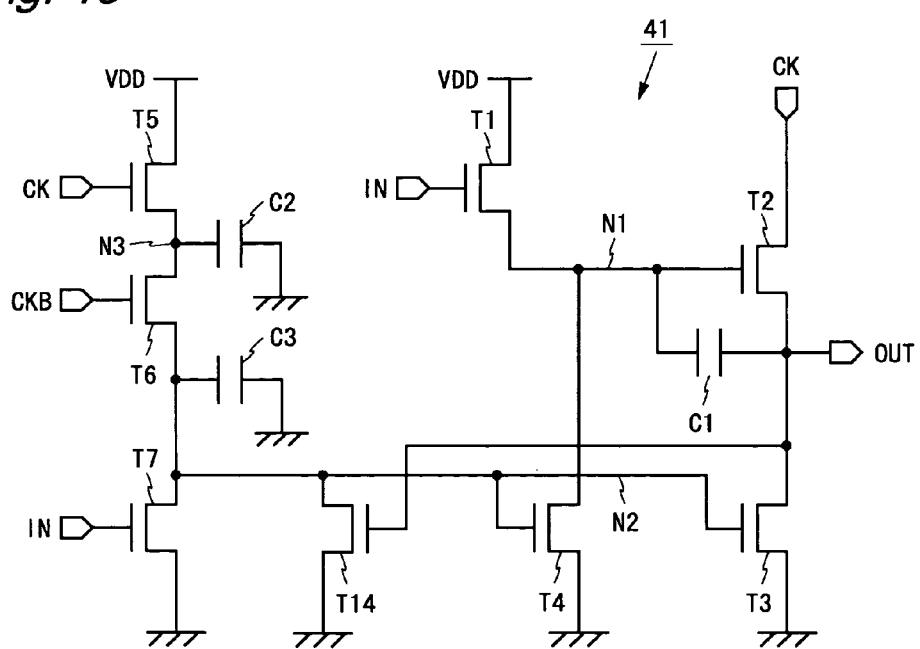
FIG. 13 is a circuit diagram of a unit circuit included in a shift register according to a fourth embodiment of the present invention.

FIG. 13 is a circuit diagram of a unit circuit 41 included in the shift register according to this embodiment. The unit circuit 41 shown in FIG. 13 corresponds to the unit circuit 11 according to the first embodiment to which a transistor T14 functioning as a reset signal fixing circuit is added. The transistor T14 has a drain terminal connected to a node N2, a gate terminal connected to an output terminal OUT, and a source terminal connected to a ground. During a period that the output terminal OUT is applied with a High voltage, the transistor T14 turns into an On state, and the node N2 is applied with a Low voltage (i.e., the reset signal is fixed at the low level).

In the unit circuit 11 according to the first embodiment, when the input signal IN changes to the low level, the node N2 turns into a floating state until the clock signal CKB changes to the high level. Herein, the voltage potential at the node N2 must be VSS in a usual case, but occasionally varies because of an influence of noise and the like. For this reason, there is a possibility that the voltage potential at the node N2 rises and the transistor T3 turns into the On state, so that the output signal OUT can not be output correctly.

In order to solve this problem, the unit circuit 41 includes the transistor T14 (the reset signal fixing circuit) that turns the reset signal into the low level during the period that the output signal OUT is at the high level. Thus, the shift register according to this embodiment can prevent erroneous operations by fixing the reset signal at the low level during the period that the output signal OUT is at the high level.

Fifth Embodiment

Figure 14:
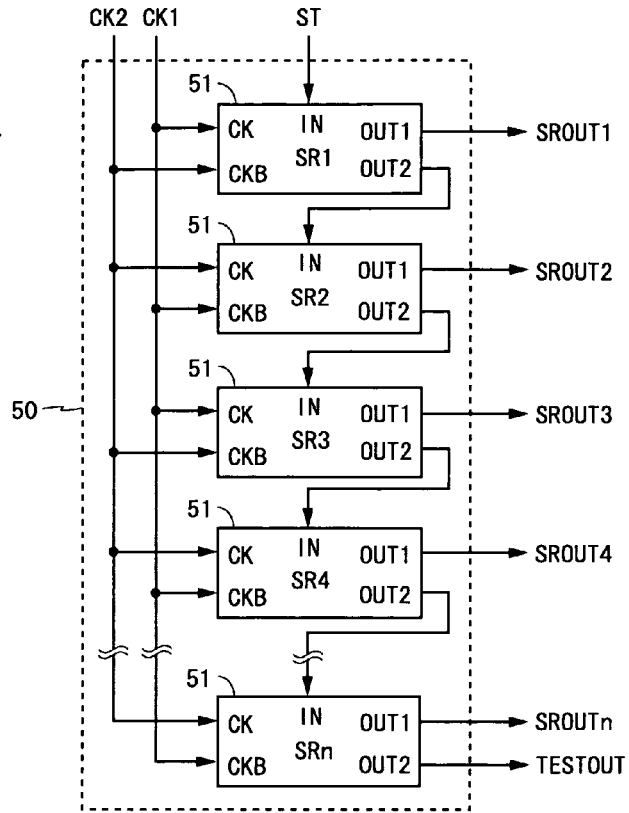
FIG. 14 is a block diagram showing a configuration of a shift register according to a fifth embodiment of the present invention.

FIG. 14 is a block diagram showing a configuration of a shift register according to a fifth embodiment of the present invention. The shift register 50 shown in FIG. 14 includes n unit circuits 51 each having an output terminal OUT1 and an output terminal OUT2. The shift register 50 corresponds to the shift register 10 according to the first embodiment to which a function of outputting a plurality of identical output signals (an output separating function) is added.

In the shift register 50, identical output signals are output from the output terminals OUT1 and OUT2 of the unit circuit 51. The output signals OUT1 from the unit circuits 51 are externally output as output signals SROUT1 to SROUTn. The output signals OUT2 from the unit circuits 51 except the n-th unit circuit 51 are supplied to input terminals IN of the subsequent unit circuits 51. The output signal OUT2 from the n-th unit circuit 51 is externally output as a test output signal TESTOUT.

Figure 15:
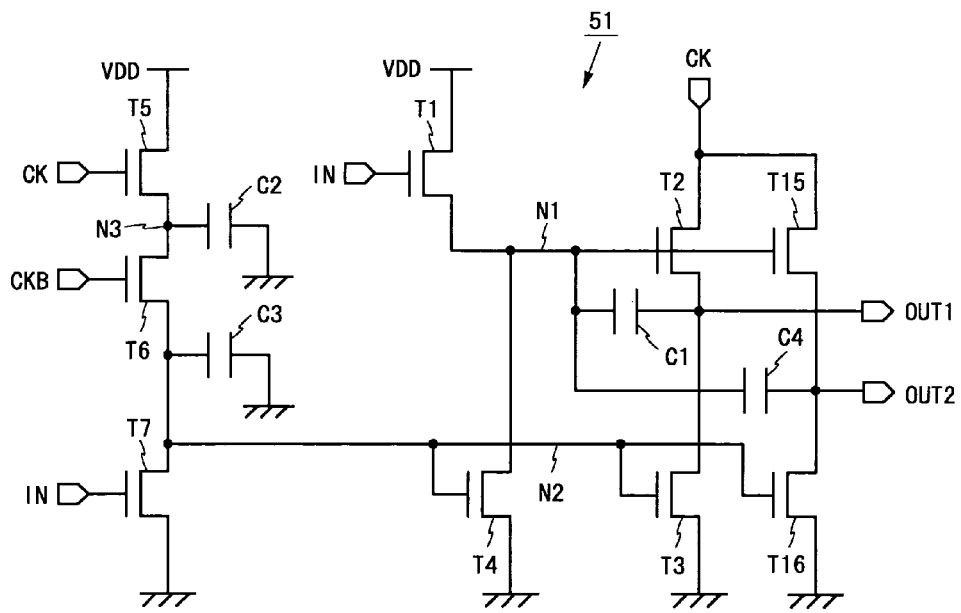
FIG. 15 is a circuit diagram of a unit circuit included in the shift register shown in FIG. 14.

FIG. 15 is a circuit diagram of the unit circuit 51 included in the shift register 50. The unit circuit 51 shown in FIG. 15 corresponds to the unit circuit 11 according to the first embodiment to which a transistor T15, a transistor T16 and a capacitor C4 are added. The transistor T15 functions as an additional output control transistor. The transistor T16 functions as an additional output reset circuit that applies a Low voltage to the output terminal OUT2 during a period that a reset signal is at a high level.

In the unit circuit 51, a connection point between transistors T2 and T3 is connected to the output terminal OUT1. The transistor T15 has a drain terminal and a gate terminal connected as in those of the transistor T2. More specifically, the transistor T15 has the drain terminal connected to a clock terminal CK, and the gate terminal connected to a node N1. A source terminal of the transistor T15 is connected to the output terminal OUT2 and a drain terminal of the transistor T16. The transistor T16 has a source terminal connected to a ground, and a gate terminal connected to a node N2. The capacitor C4 is provided between the gate terminal and the source terminal of the transistor T15.

In the shift register 50, the external output signal (the output signal OUT1) and the input signal (the output signal OUT2) to the subsequent unit circuit are output from the unit circuit 51 in a separate manner. Therefore, even when a level of the output signal OUT1 varies because of an influence of external noise and the like, this influence is not exerted on the input signal to the subsequent unit circuit. Thus, the shift register 50 according to this embodiment can prevent erroneous operations by outputting the external output signal and the input signal to the subsequent unit circuit in a separate manner.

The unit circuit 51 may include both of or one of a capacitor C1 and the capacitor C4. A capacitance value of the capacitor C4 is set to become small, leading to reduction of an influence to be exerted on the output signal OUT2 because of level variations of clock signals CK1 and CK2. Moreover, a capacitance value of the capacitor C1 is set to become small, leading to reduction of an influence to be exerted on the output signal OUT2 because of a level variation of the output signal OUT1. In view of these points, the capacitance values of the capacitors C1 and C4 are determined appropriately, so that it is possible to operate the shift register 50 in an optimal state while reducing an influence of external noise.

Moreover, since the n-th output signal OUT2 is output as the test output signal TESTOUT, it is possible to output a test output signal without changing a load of the n-th output signal OUT1 and without providing a dummy stage.

Sixth Embodiment

Figure 16:
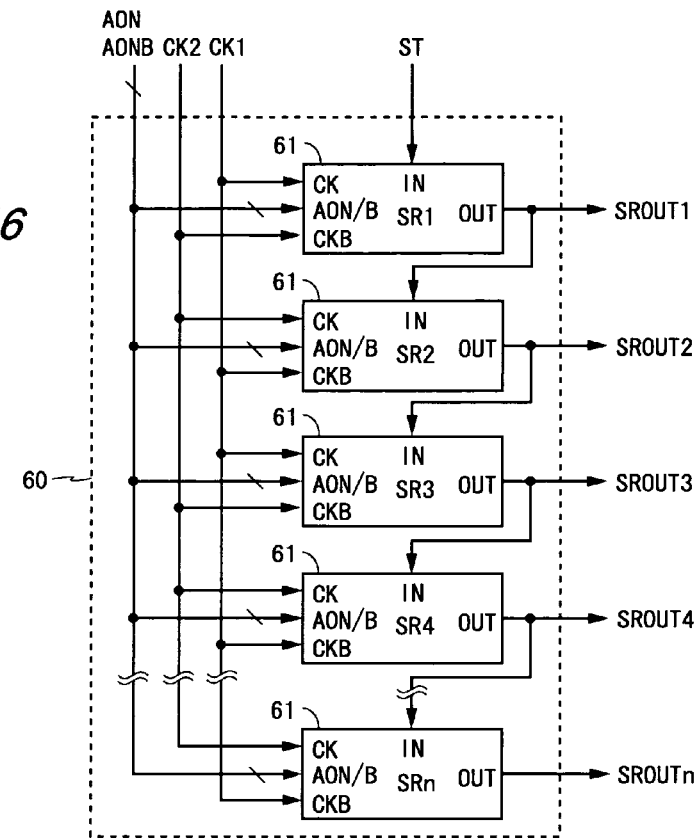
FIG. 16 is a block diagram showing a configuration of a shift register according to a sixth embodiment of the present invention.

FIG. 16 is a block diagram showing a configuration of a shift register according to a sixth embodiment of the present invention. The shift register 60 shown in FIG. 16 includes n unit circuits 61 each having an all-on control terminal AON and an all-on control terminal AONB. The shift register 60 corresponds to the shift register 10 according to the first embodiment to which a function of turning all output signals into a high level (an all-on function) is added. In the unit circuit 61, the all-on control terminals AON and AONB are supplied with all-on control signals AON and AONB (negation of AON) each given externally.

Figure 17:
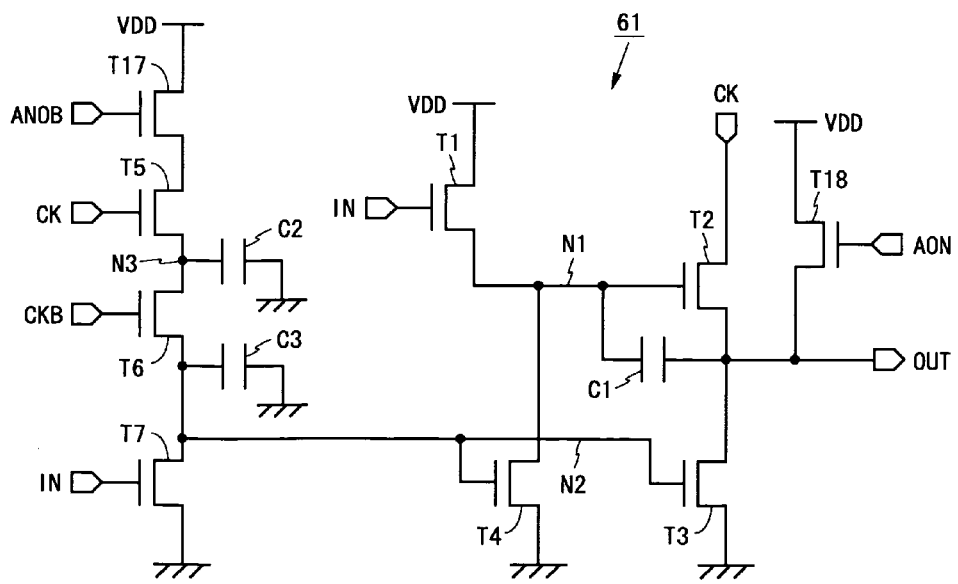
FIG. 17 is a circuit diagram of a unit circuit included in the shift register shown in FIG. 16.

FIG. 17 is a circuit diagram of the unit circuit 61 included in the shift register 60. The unit circuit 61 shown in FIG. 17 corresponds to the unit circuit 11 according to the first embodiment to which transistors T17 and T18 each functioning as an all-on control circuit are added. The transistor T17 has a drain terminal applied with a power supply voltage VDD, a source terminal connected to a drain terminal of a transistor T5, and a gate terminal connected to the all-on control terminal AONB. The transistor T18 has a drain terminal applied with the power supply voltage VDD, a source terminal connected to an output terminal OUT, and a gate terminal connected to the all-on control terminal AON.

When the all-on control signal AON is at a low level and the all-on control signal AONB is at the high level, the transistor T17 turns into an On state, the transistor T18 turns into an Off state, and the unit circuit 61 operates as in the unit circuit 11 according to the first embodiment. When the all-on control signal AON is at the high level and the all-on control signal AONB is at the low level, the transistor T17 turns into the Off state, and the transistor T18 turns into the On state. Herein, a transistor T7 turns into the On state, a voltage potential at a node N2 turns into VSS, and a voltage potential at an output terminal OUT turns into VDD.

Figure 18:
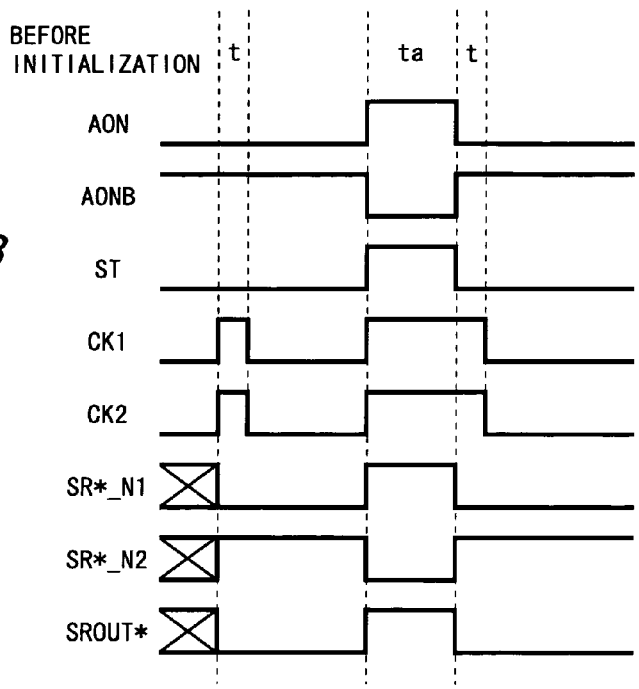
FIG. 18 is a timing chart of the shift register shown in FIG. 16.

FIG. 18 is a timing chart of the shift register 60. In FIG. 18, during a period t that the all-on control signal AON and a start pulse ST turn into the low level whereas the all-on control signal AONB, a clock signal CK1 and a clock signal CK2 turn into the high level, the voltage potential at the node N2 turns into VDD whereas a voltage potential at a node N1 and the voltage potential at the output terminal OUT turn into VSS in the unit circuit 61, as in the period t shown in FIG. 6. During a period to that the all-on control signal AON, the start pulse ST, the clock signal CK1 and the clock signal CK2 turn into the high level whereas the all-on control signal AONB turns into the low level, the voltage potential at the node N2 turns into VSS, and the voltage potential at the node N1 and the voltage potential at the output terminal OUT turn into VDD.

The shift register 60 according to this embodiment can turn all output signals SROUT1 to SROUTn into the high level when the all-on control signals AON and AONB are supplied externally upon turn-on, testing and the like.

Seventh Embodiment

Figure 19:
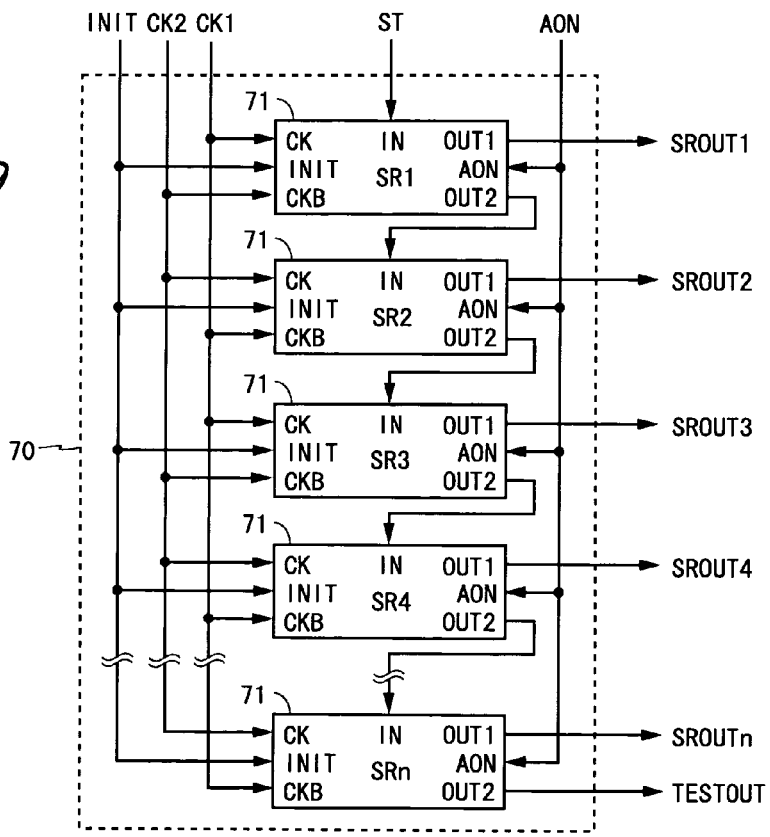
FIG. 19 is a block diagram showing a configuration of a shift register according to a seventh embodiment of the present invention.

FIG. 19 is a block diagram showing a configuration of a shift register according to a seventh embodiment of the present invention. The shift register 70 shown in FIG. 19 includes n unit circuits 71 each having an initialization terminal INIT, an all-on control terminal AON, an output terminal OUT1 and an output terminal OUT2. The shift register 70 corresponds to the shift register 10 according to the first embodiment to which an output separating function and an all-on function are added.

In the shift register 70, as in the shift register 50, output signals OUT1 from the unit circuits 71 are externally output as output signals SROUT1 to SROUTn. Output signals OUT2 from the unit circuits 71 except the n-th unit circuit 71 are supplied to input terminals IN of the subsequent unit circuits 71, and an output signal OUT2 from the n-th unit circuit 71 is externally output as a test output signal TESTOUT. In the unit circuit 71, the initialization terminal INIT and the all-on control terminal AON are supplied with an initialization signal INIT and an all-on control signal AON each given externally.

Figure 20:
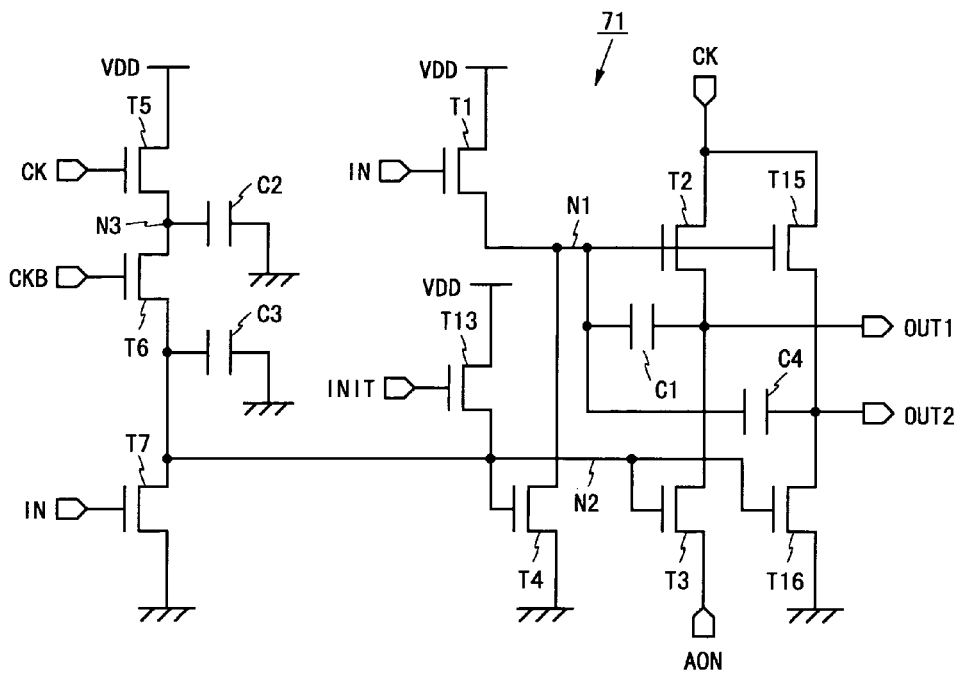
FIG. 20 is a circuit diagram of a unit circuit included in the shift register shown in FIG. 19.

FIG. 20 is a circuit diagram of the unit circuit 71 included in the shift register 70. The unit circuit 71 shown in FIG. 20 corresponds to the unit circuit 51 according to the fifth embodiment to which a transistor T13 is added and in which a part to be connected with a source terminal of a transistor T3 is changed. The transistor T13 is identical in connection form and function to that according to the third embodiment. The source terminal of the transistor T3 is connected to the all-on control terminal AON.

When the initialization signal INIT is at a low level and the all-on control signal AON is at the low level, the transistor T13 turns into an Off state, the source terminal of the transistor T3 is applied with a voltage potential VSS, and the unit circuit 71 operates as in the unit circuit 11 according to the first embodiment. During a period that the initialization signal INIT is at a high level, moreover, the transistor T13 turns into an On state, a voltage potential at a node N2 turns into VDD, and the transistor T3 and a transistor T16 turn into the On state. Herein, when the all-on control signal AON turns into the high level, a voltage potential at the output terminal OUT2 is maintained at VSS, and a voltage potential at the output terminal OUT1 turns into VDD. The same thing holds true for a case where clock signals CK1 and CK2 turn into the high level in place of the initialization signal INIT.

Figure 21:
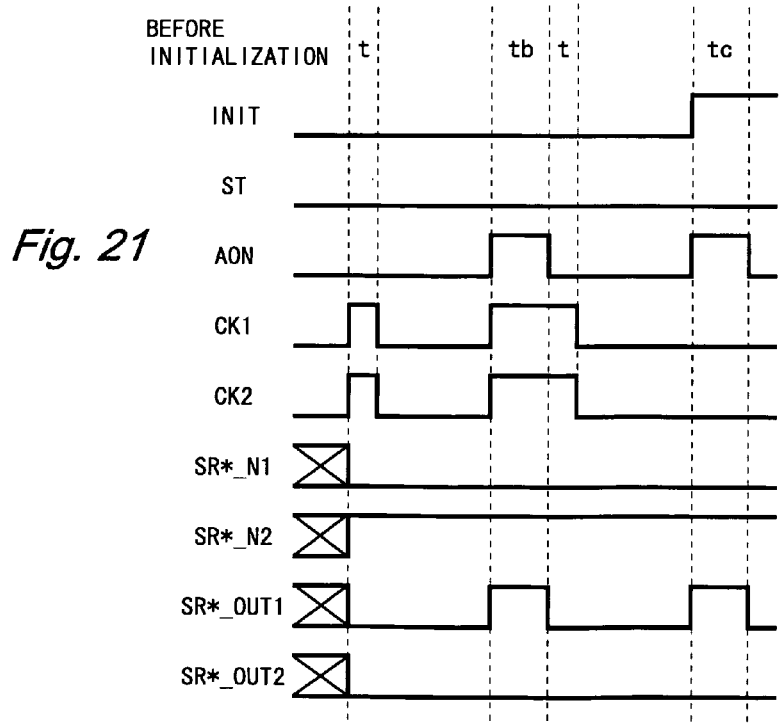
FIG. 21 is a timing chart of the shift register shown in FIG. 19.

FIG. 21 is a timing chart of the shift register 70. In FIG. 21, during a period t that the initialization signal INIT, a start pulse ST and the all-on control signal AON turn into the low level whereas the clock signal CK1 and the clock signal CK2 turn into the high level, the voltage potential at the node N2 turns into VDD whereas a voltage potential at a node N1, the voltage potential at the output terminal OUT1 and the voltage potential at the output terminal OUT2 turn into VSS in the unit circuit 71, as in the period t shown in FIG. 6. During a period tb that the initialization signal INIT and the start pulse ST turn into the low level whereas the all-on control signal AON, the clock signal CK1 and the clock signal CK2 turn into the high level, the voltage potential at the node N2 and the voltage potential at the output terminal OUT1 turn into VDD whereas the voltage potential at the node N1 and the voltage potential at the output terminal OUT2 turn into VSS. The same thing holds true for a period tc that the initialization signal INIT and the all-on control signal AON turn into the high level whereas the start pulse ST, the clock signal CK1 and the clock signal CK2 turn into the low level.

The shift register 70 according to this embodiment can prevent erroneous operations by outputting the external output signal and the input signal to the subsequent unit circuit from the unit circuit 71 in a separate manner, and can turn all the output signals SROUT1 to SROUTn into the high level by receiving the initialization signal INIT and the all-on control signal AON externally upon turn-on, testing and the like.

Eighth Embodiment

Figure 22:
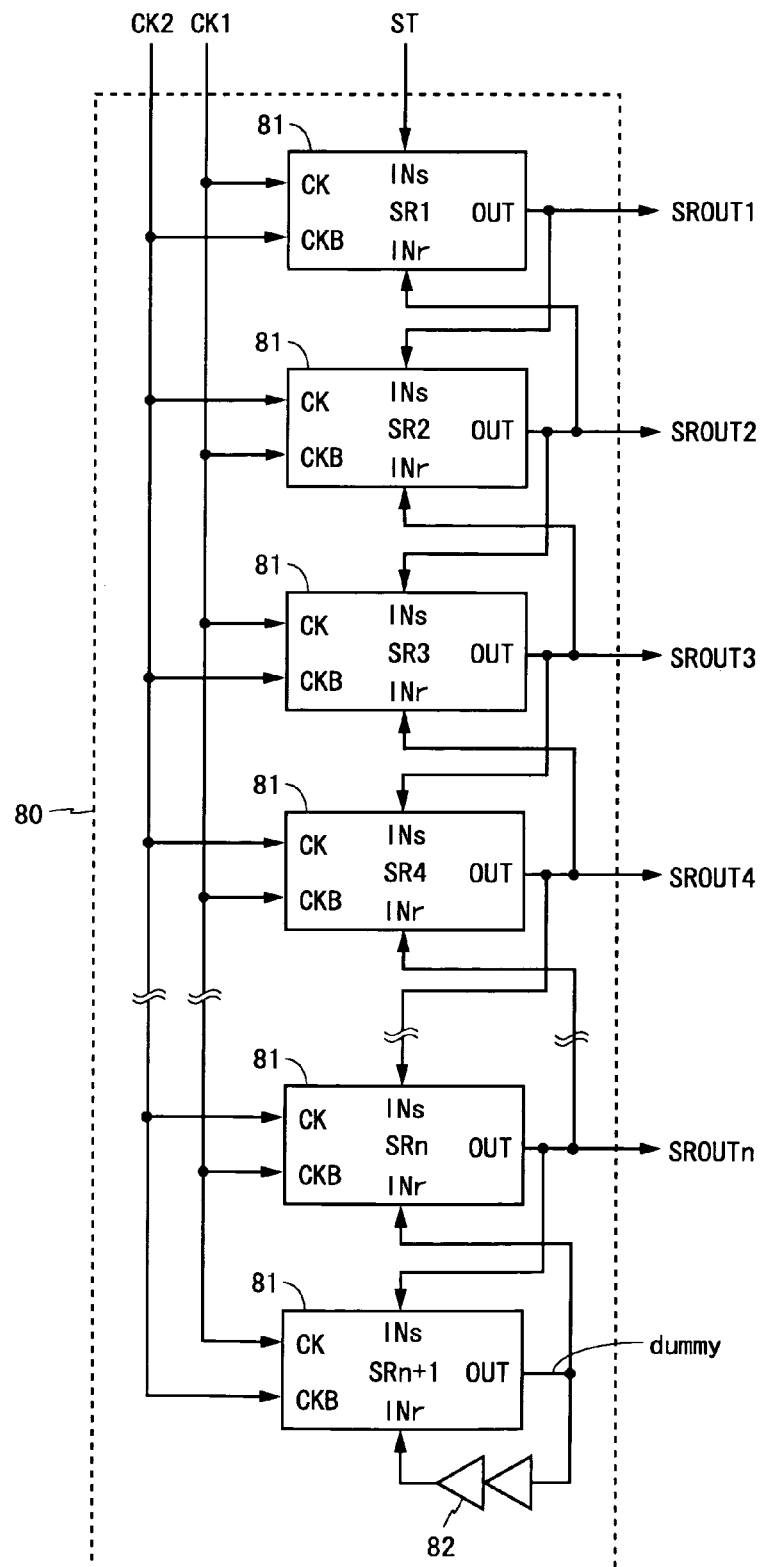
FIG. 22 is a block diagram showing a configuration of a shift register according to an eighth embodiment of the present invention.

FIG. 22 is a block diagram showing a configuration of a shift register according to an eighth embodiment of the present invention. The shift register 80 shown in FIG. 22 includes (n+1) unit circuits 81 each having an input terminal INs and an input terminal INr. By use of an output signal from a subsequent circuit, the shift register 80 performs discharge of a node N1 and pull-down of an output signal.

In the shift register 80, a start pulse ST is supplied to the input terminal INs of the first unit circuit 81. Output signals OUT from the unit circuits 81 except the (n+1)-th unit circuit 81 are supplied to the input terminals INs of the subsequent unit circuits 81 and the input terminals INr of the preceding unit circuits 81. An output signal OUT (an output signal "dummy") from the (n+1)-th unit circuit 81 is supplied to the input terminal INr of the (n+1)-th unit circuit 81 via a buffer 82.

Figure 23:
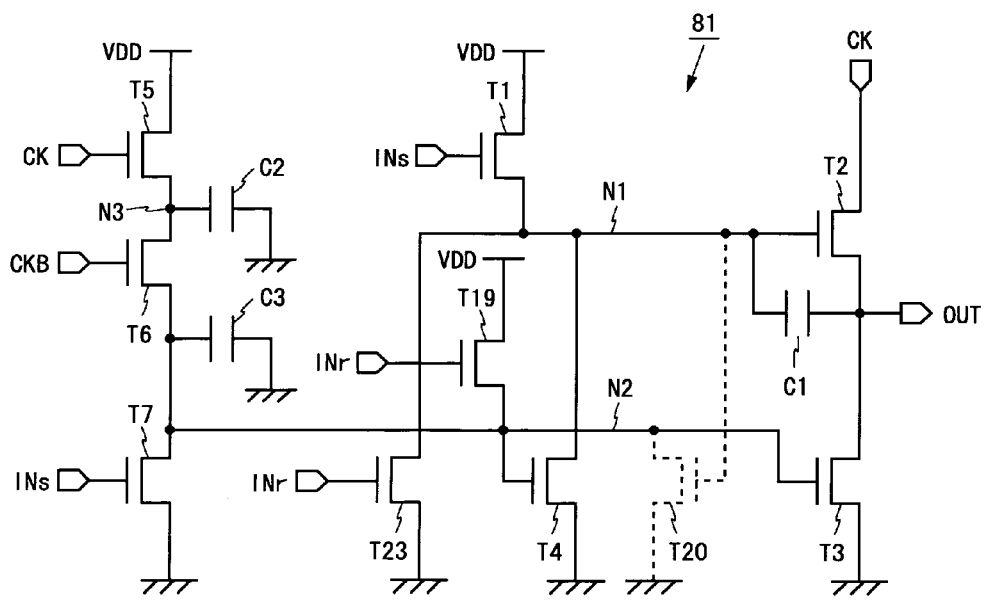
FIG. 23 is a circuit diagram of a unit circuit included in the shift register shown in FIG. 22.

FIG. 23 is a circuit diagram of the unit circuit 81 included in the shift register 80. As shown in FIG. 23, the unit circuit 81 corresponds to the unit circuit 11 according to the first embodiment to which transistors T19 and T23 are added and in which parts to be connected with gate terminals of transistors T1 and T7 are changed. The transistor T19 has a drain terminal applied with a power supply voltage VDD, and a source terminal connected to a node N2. Moreover, the transistor T23 has a drain terminal connected to a node N1, and a source terminal connected to a ground. The gate terminals of the transistors T1 and T7 are connected to the input terminal INs, and gate terminals of the transistors T19 and T23 are connected to the input terminal INr. In order to stabilize an operation of the unit circuit 81, a transistor T20 having a gate terminal connected to the node N1 may be provided between the node N2 and the ground.

During a period that the output signal from the preceding unit circuit 81 (the input signal INs) is at a high level, the transistors T1 and T7 turn into an On state, the node N1 is applied with a High voltage, and the node N2 is applied with a Low voltage. During a period that the output signal from the subsequent unit circuit (the input signal INr) is at the high level, the transistors T19 and T23 turn into the On state, the node N1 is applied with the Low voltage, and the node N2 is applied with the High voltage.

In the unit circuit 81, a reset signal generation circuit configured with a transistor T5, a transistor T6, the transistor T7, a capacitor C2 and a capacitor C3 generates a reset signal which turns into the high level in a normal state, by use of two-phase clock signals CK1 and CK2, and changes the reset signal to a low level when an input signal IN turns into the high level. This reset signal is supplied to gate terminals of the transistors T3 and T4, and is used for discharge of the node N1 and pull-down of the output signal OUT.

The input signal INr is also used for discharge of the node N1 and pull-down of the output signal OUT. When the input signal INr turns into the high level, the transistor T23 turns into the On state, and a voltage potential at the node N1 turns into VSS. Moreover, when the input signal INr turns into the high level, the transistor T19 turns into the On state, and a voltage potential at the node N2 turns into VDD. Therefore, the transistor T3 turns into the On state, and a voltage potential at the output terminal OUT turns into VSS. A circuit configured with the transistors T5 and T6 and the capacitors C2 and C3 has a function of not allowing the voltage potential at the node N2 to rise to VDD, but maintaining the voltage potential at the node N2 at VDD.

Figure 24:
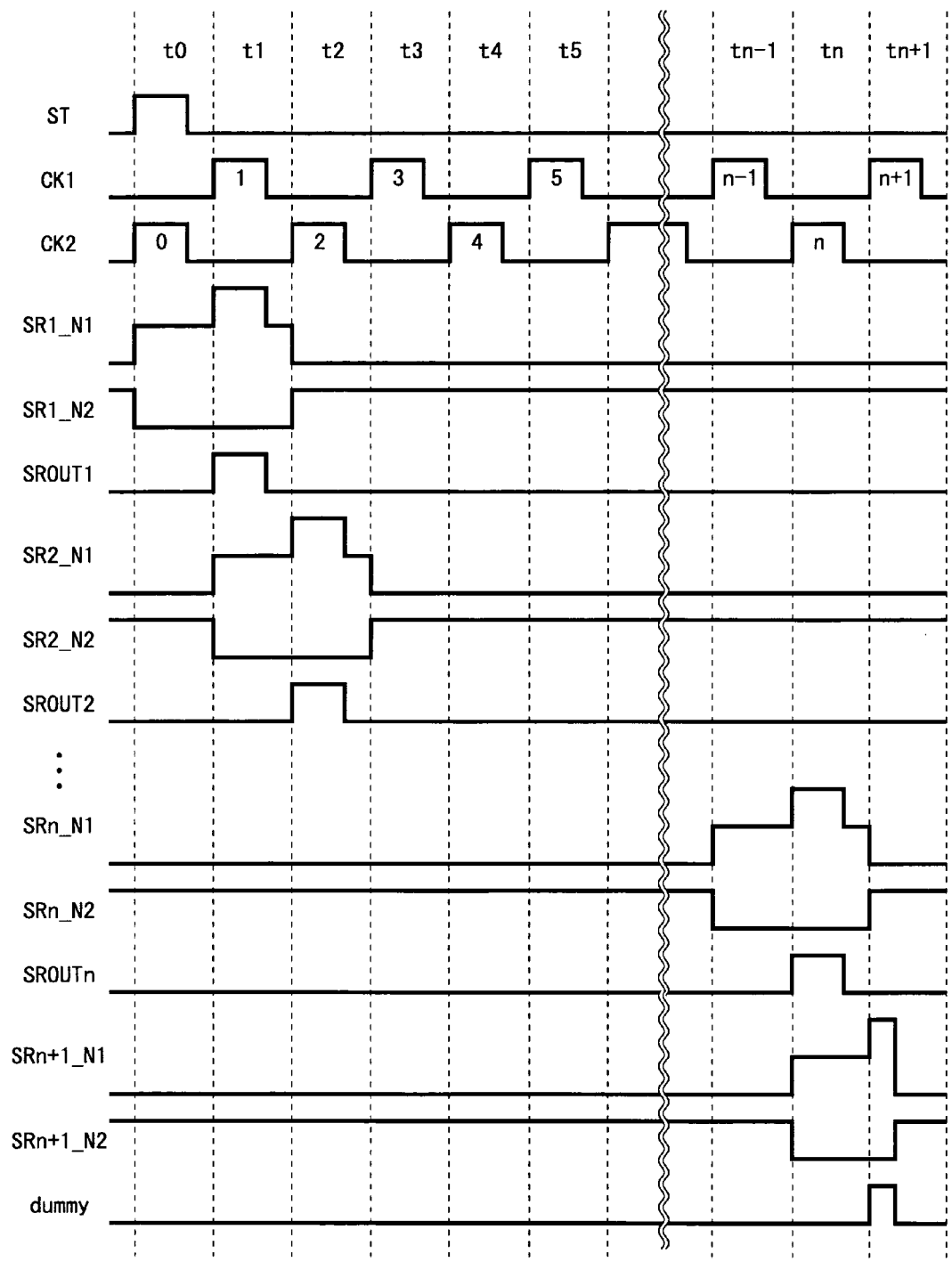
FIG. 24 is a timing chart of the shift register shown in FIG. 22.

FIG. 24 is a timing chart of the shift register 80. The timing chart shown in FIG. 24 is different from the timing chart shown in FIG. 3 in the following points. In FIG. 3, the voltage potential at the node N2 in the unit circuit 11 gradually rises from VSS to reach VDD. In FIG. 24, on the other hand, the voltage potential at the node N2 in the unit circuit 81 changes to VDD immediately when the output signal OUT changes to the low level.

Like the shift register 80 according to this embodiment, it is possible to perform the discharge of the node N1 and the pull-down of the output signal OUT by use of the output signal from the subsequent circuit, to generate the reset signal at the high level by use of the two-phase clock signals CK1 and CK2 whose high level periods do not overlap with each other, and to fix the output signal OUT at the low level by use of the reset signal.

Figure 25:
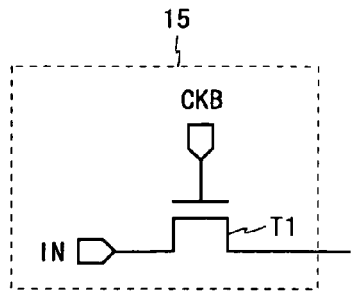
FIG. 25 is a circuit diagram of a precharge circuit included in a shift register according to a first modification example of the present invention.
Figure 26:
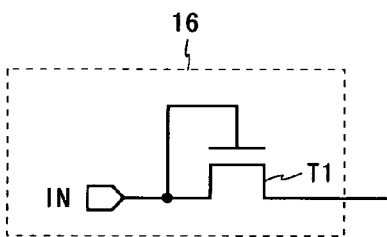
FIG. 26 is a circuit diagram of a different precharge circuit included in the shift register according to the first modification example of the present invention.

With regard to the shift registers according to the first to eighth embodiments, various modification examples may be employed. Hereinafter, as one example, description will be given of a modification example of the shift register 10 according to the first embodiment. For example, the unit circuit 11 may include a precharge circuit 15 shown in FIG. 25 or a precharge circuit 16 shown in FIG. 26, in place of the precharge circuit 13 shown in FIG. 2. The gate terminal of the transistor T1 is connected to a clock terminal CKB in the precharge circuit 15 or is connected to an input terminal IN in the precharge circuit 16.

Each of the precharge circuits 13, 15 and 16 applies a High voltage to the node N1 (the gate terminal of the transistor T2) during the period that the input signal IN is at the high level. The precharge circuit 13 has an effect that a load is light because an input signal is supplied to a gate terminal of a transistor. The precharge circuit 15 has an effect that it also functions as a discharge circuit that discharges the electrical charge stored in the node N1 when the clock signal CKB is at the high level and the input signal IN is at the low level. The precharge circuit 16 has an effect that it can reduce a stress due to a gate-drain voltage.

Figure 27:
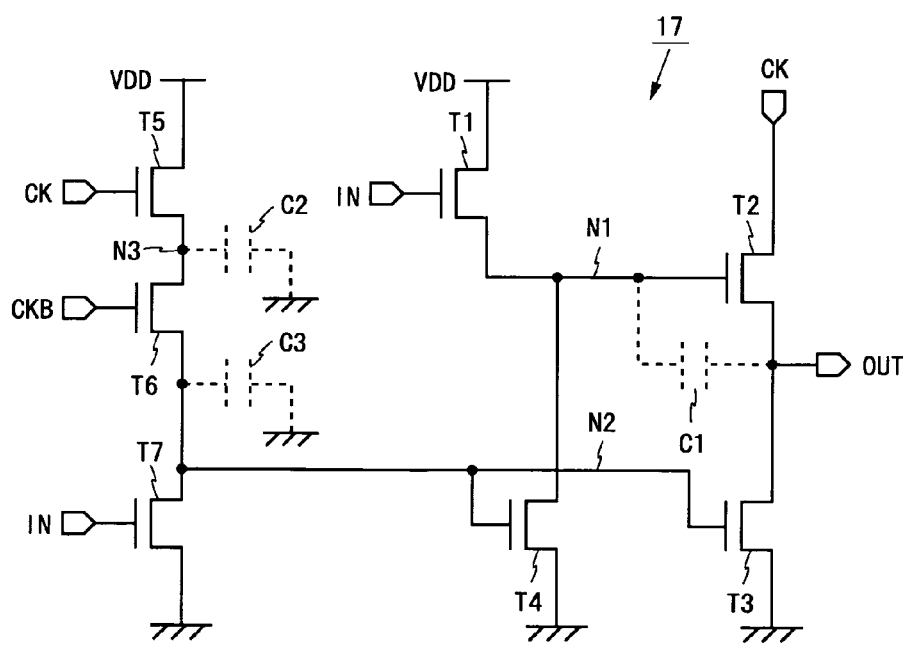
FIG. 27 is a circuit diagram of a unit circuit included in a shift register according to a second modification example of the present invention.

Like a unit circuit 17 shown in FIG. 27, moreover, all of or part of capacitors C1 to C3 may be configured using a wiring capacitor or a parasitic capacitor of a transistor, rather than a capacitive element. Thus, it is possible to reduce an amount of circuits because a capacitive element is not provided.

In the unit circuit 11, the voltage potential at the node N1 becomes higher than VDD; therefore, a high voltage is applied between the drain and the gate of the transistor T1, between the drain and the gate of the transistor T4, and between the drain and the source of the transistor T4. If the high voltage exceeds a withstand voltage, the transistors T1 and T4 are broken down. Even when the high voltage does not exceed the withstand voltage, it is not preferred for the transistors T1 and T4 to be continuously applied with the high-voltage stress. Moreover, the high voltage is applied between the drain and the source, so that an off leak current increases in each of the transistors T1 and T4. As a result, there is a possibility that the voltage potential at the node N1 in the floating state drops, leading to erroneous operations of the shift register 10.

Figure 28:
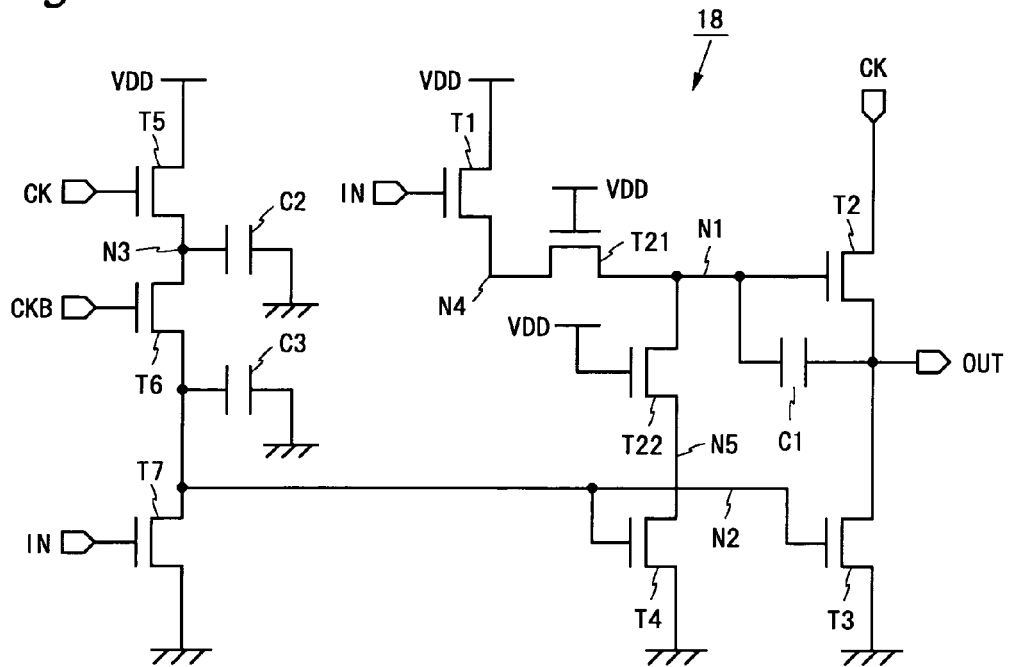
FIG. 28 is a circuit diagram of a unit circuit included in a shift register according to a third modification example of the present invention.
Figure 29:
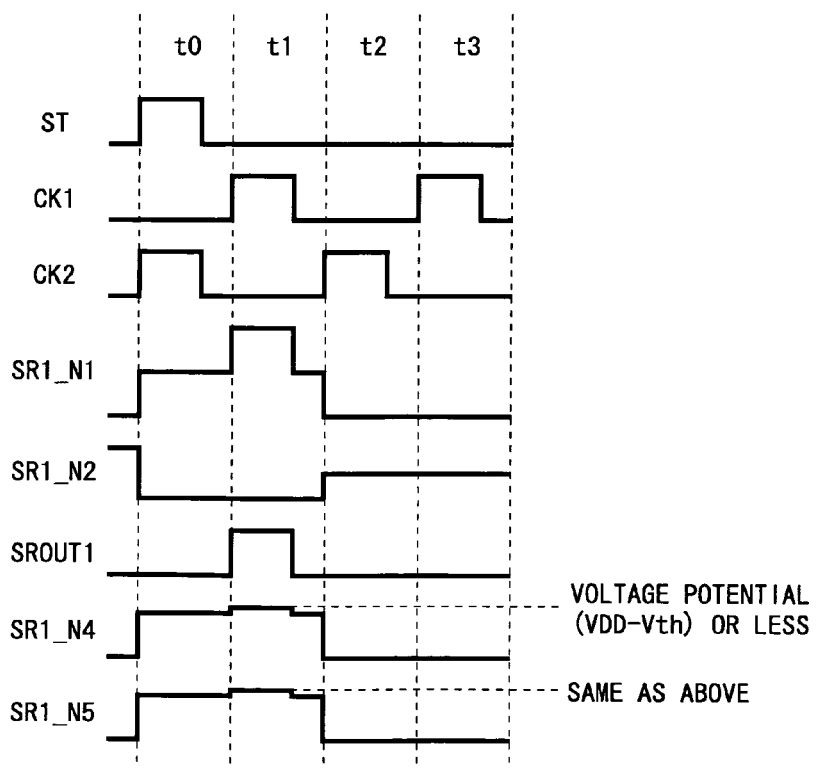
FIG. 29 is a timing chart of the shift register according to the third modification example of the present invention.

As a countermeasure against the withstand voltage and the off leak current, like a unit circuit 18 shown in FIG. 28, transistors T21 and T22 each having a gate terminal applied with the power supply voltage VDD may be provided between the node N1 and the source terminal of the transistor T1 and between the node N1 and the drain terminal of the transistor T4. The unit circuit 18 may include both of or one of the transistors T21 and T22. In a case where a connection point between the transistors T1 and T21 is defined as a node N4 and a connection point between the transistors T4 and T22 is defined as a node N5, a voltage potential at the node N4 and a voltage potential at the node N5 constantly become (VDD−Vth) or less (see FIG. 29).

As countermeasures against the off leak current, additionally, there are considered a method of extending a gate length of the transistors T1 and T4, a method of configuring each of the transistors T1 and T4 with a plurality of transistors connected in series, a method of configuring each of the transistors T1 and T4 by use of an LDD (Lightly Doped Drain) structure, and the like.

Figure 30:
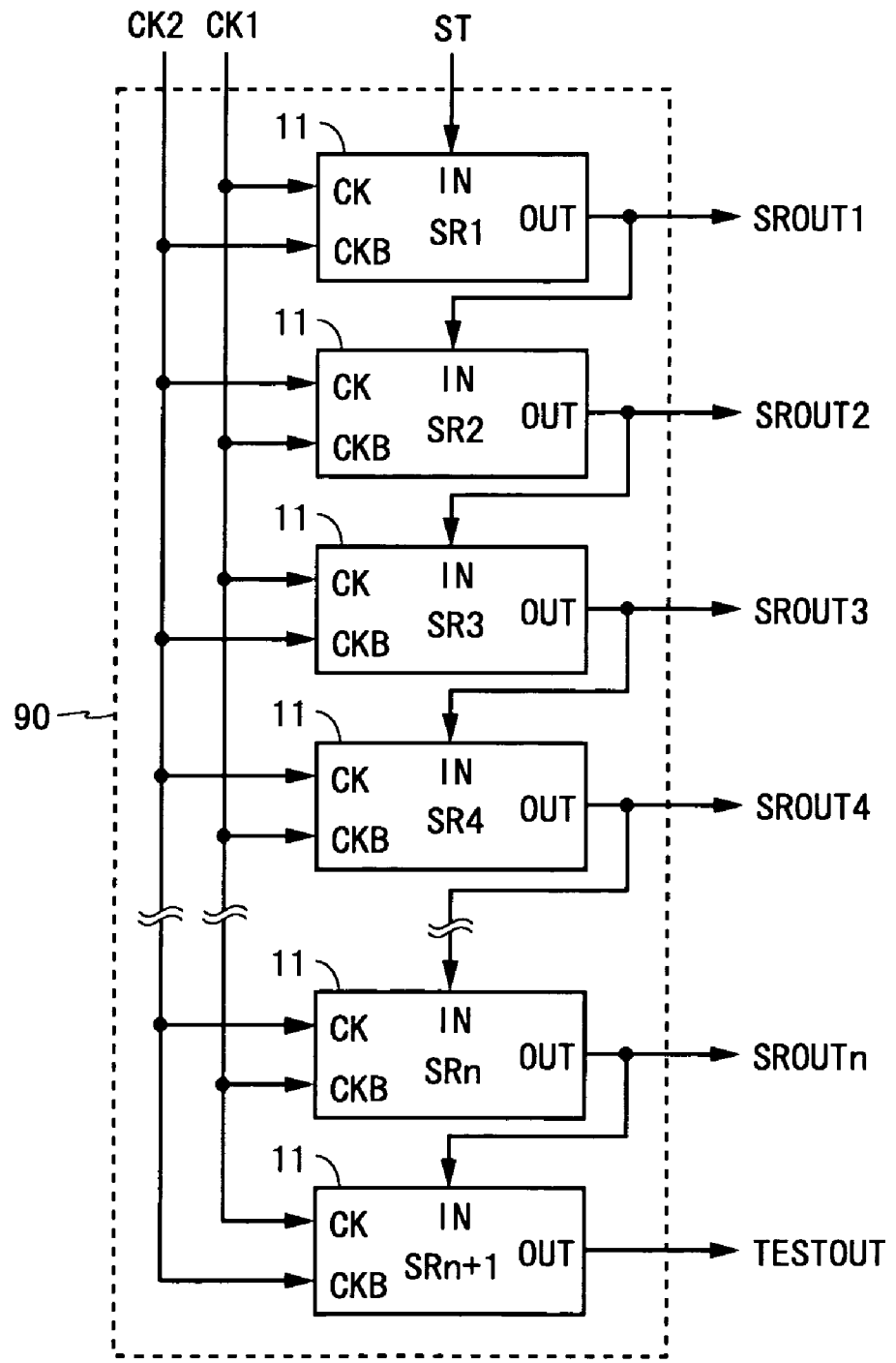
FIG. 30 is a block diagram showing a configuration of a shift register according to a fourth modification example of the present invention.

Like a shift register 90 shown in FIG. 30 corresponding to the shift register 10 to which a unit circuit 11 is added as a dummy stage, an output signal OUT from the (n+1)-th unit circuit 11 may be output as a test output signal TESTOUT. Thus, it is possible to further reduce an influence of noise to be exerted on the test output signal TESTOUT from an external device and to prevent erroneous operations of a shift register, as compared with the shift register 50 having the output separating function (FIG. 14).

Figure 31:
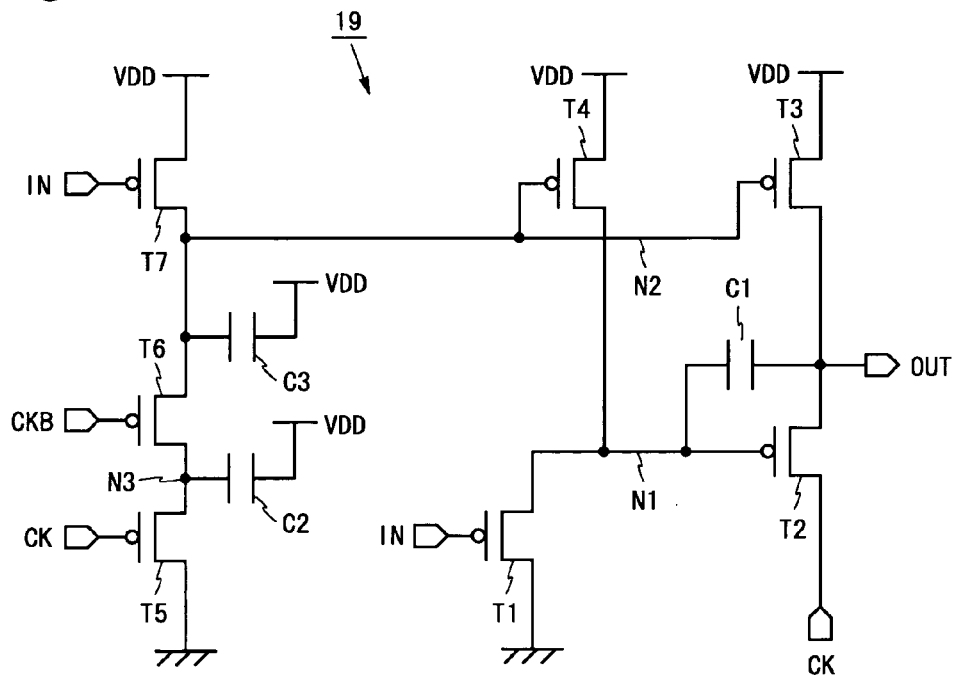
FIG. 31 is a circuit diagram of a unit circuit included in a shift register according to a fifth modification example of the present invention.
Figure 32:
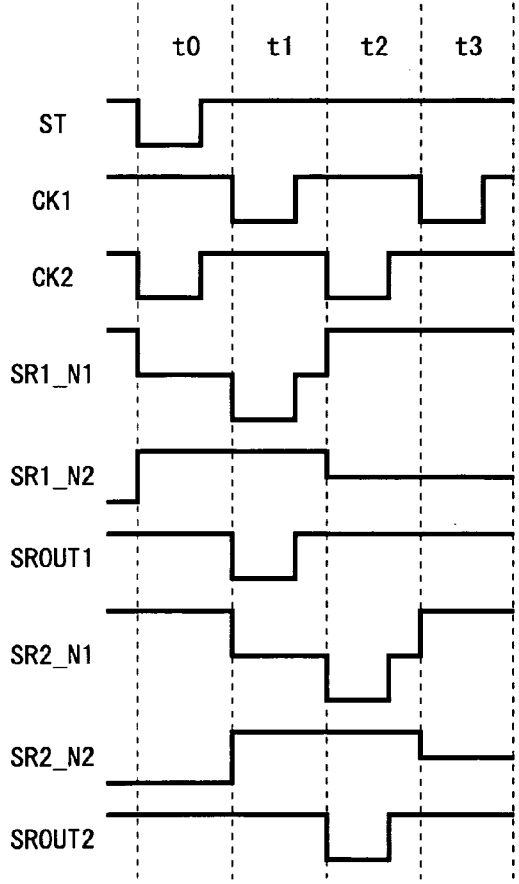
FIG. 32 is a timing chart of the shift register according to the fifth modification example of the present, invention.
Figure 33:
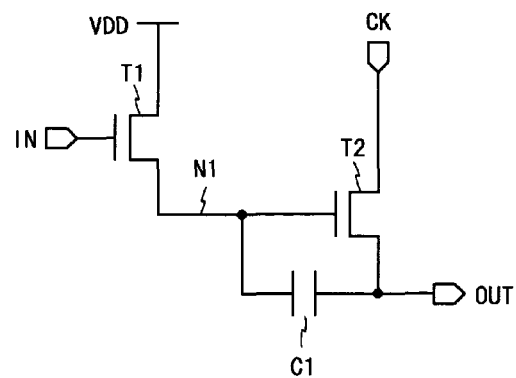
FIG. 33 is a circuit diagram of a bootstrap circuit included in a shift register.
Figure 34:
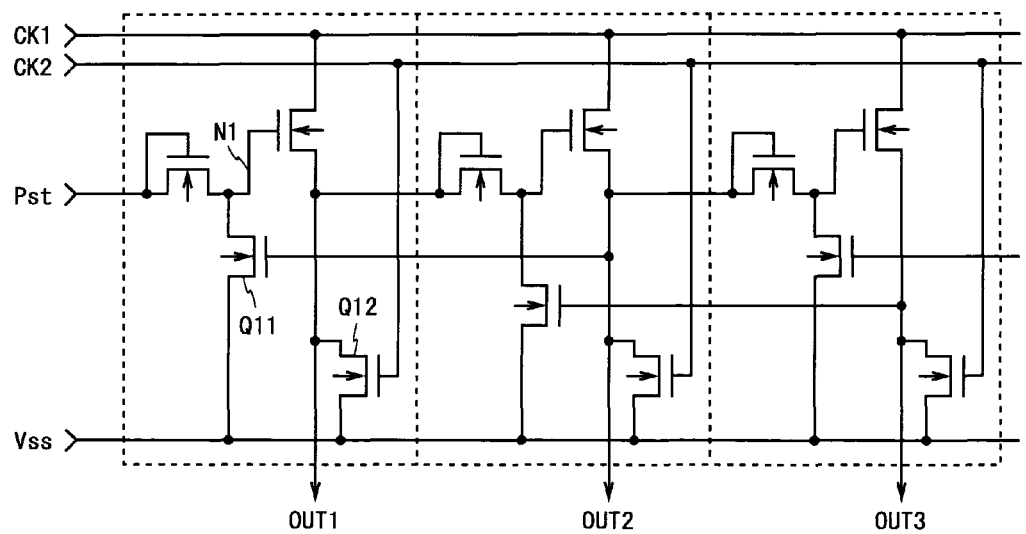
FIG. 34 is a circuit diagram showing a configuration of a conventional shift register.
Figure 35:
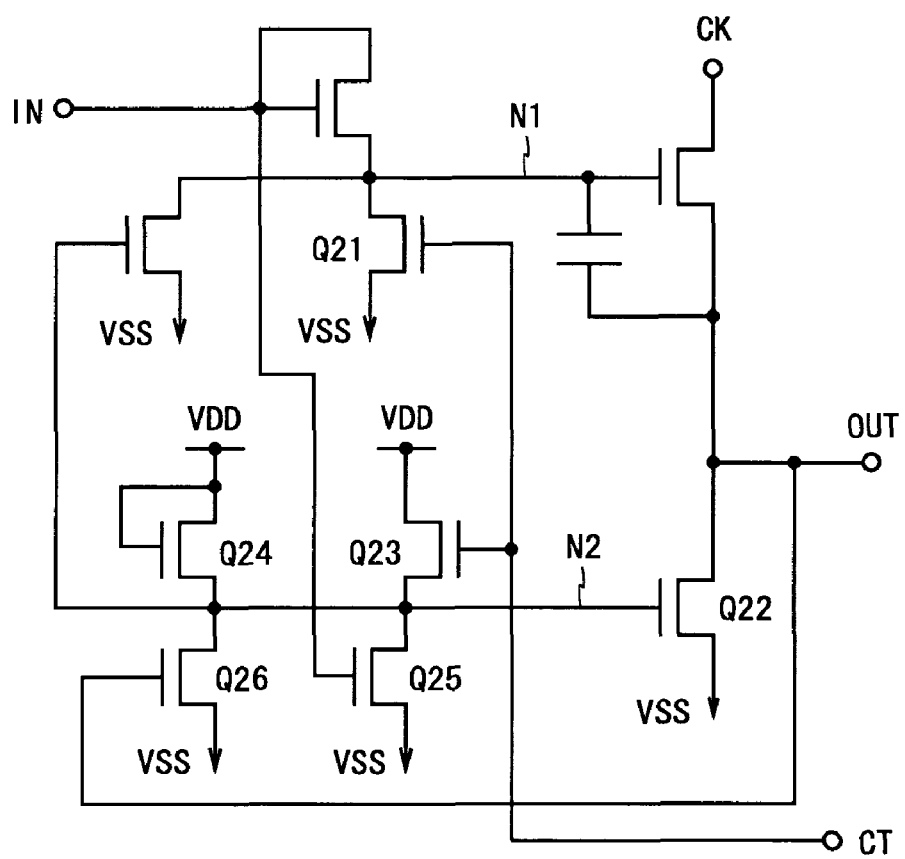
FIG. 35 is a circuit diagram showing a configuration of a different conventional shift register.

As shown in FIG. 31, moreover, a unit circuit 19 may be configured with a P-channel type transistor, and a shift register having n stages may be configured in such a manner that a plurality of unit circuits 19 are cascaded. FIG. 32 is a timing chart of the shift register including the unit circuit 19. The unit circuit 19 is similar in specific configuration and operation to the unit circuit 11; therefore, description thereof will not be given here.

A modification example similar to that of the first embodiment may be employed with regard to the shift registers according to the second to eighth embodiments. A novel shift register may be configured by an optional combination of the characteristics of the shift registers according to the first to eighth embodiments and the modification examples thereof as long as such a combination is not against properties of the characteristics. Thus, it is possible to obtain a power-saving shift register capable of fixing an output signal at a predetermined level in a normal state without allowing a through current to flow therein.

Industrial Applicability

The shift register of the present invention can fix an output signal at a predetermined level in a normal state without allowing a through current to flow therein, and brings about an effect of achieving low power consumption. Therefore, the shift register of the present invention is applicable as a drive circuit in a display device and an imaging device, or the like, for example.

The invention claimed is:

1. A shift register having a configuration in that unit circuits each configured with transistors of an identical conduction type are cascaded, and configured to operate based on two-phase clock signals whose on-level periods do not overlap with each other, wherein the unit circuit includes:

an output control transistor having a first conduction terminal configured to receive one of the clock signals, and a second conduction terminal connected to an output terminal;

a precharge circuit for applying an on-voltage to a control terminal of the output control transistor during a period that an input signal is at an on-level;

a reset signal generation circuit for generating a reset signal which turns into the on-level in a normal state, by use of the two-phase clock signals, and changing the reset signal to an off-level when the input signal turns into the on-level; and a discharge circuit for applying an off-voltage to the control terminal of the output control transistor during a period that the reset signal is at the on-level.

2. The shift register according to claim 1, wherein the unit circuit further includes an output reset circuit for applying the off-voltage to the output terminal during the period that the reset signal is at the on-level.

3. A display device comprising:

a plurality of pixel circuits arranged in a two dimensional manner; and a drive circuit including the shift register according to claim 2.

4. The shift register according to claim 1, wherein the reset signal generation circuit includes:

a first transistor having a control terminal configured to receive one of the clock signals, and a first conduction terminal configured to receive the on-voltage;

a second transistor having a control terminal configured to receive the remaining clock signal, and a first conduction terminal connected to a second conduction terminal of the first transistor; and a third transistor having a control terminal configured to receive the input signal, a first conduction terminal connected to a second conduction terminal of the second transistor, and a second conduction terminal configured to receive the off-voltage, and the reset signal is output from a connection point between the second and third transistors.

5. A display device comprising:

a plurality of pixel circuits arranged in a two dimensional manner; and a drive circuit including the shift register according to claim 4.

6. The shift register according to claim 1, wherein the unit circuit further includes an initialization circuit for fixing the reset signal at the on-level in accordance with an initialization signal.

7. A display device comprising:

a plurality of pixel circuits arranged in a two dimensional manner; and a drive circuit including the shift register according to claim 6.

8. The shift register according to claim 1, wherein the unit circuit further includes an additional output control transistor having a control terminal and a first conduction terminal configured to receive one of the clock signals, and a second conduction terminal connected to an additional output terminal, and the output terminal is configured to output a first output signal externally, and the additional output terminal is configured to supply a second output signal to the subsequent unit circuit.

9. The shift register according to claim 8, wherein the unit circuit further includes an additional output reset circuit for applying the off-voltage to the additional output terminal during the period that the reset signal is at the on-level.

10. A display device comprising:

a plurality of pixel circuits arranged in a two dimensional manner; and a drive circuit including the shift register according to claim 9.

11. A display device comprising:

a plurality of pixel circuits arranged in a two dimensional manner; and a drive circuit including the shift register according to claim 8.

12. A display device comprising:

a plurality of pixel circuits arranged in a two dimensional manner; and a drive circuit including the shift register according to claim 1.

* * * * *